United States Patent
Hara et al.

(10) Patent No.: US 9,356,052 B2
(45) Date of Patent: May 31, 2016

(54) THIN FILM TRANSISTOR WITH INTEGRATED CONNECTING PORTION

(71) Applicant: Sharp Kabushiki Kaisha, Osaka-shi, Osaka (JP)

(72) Inventors: Yoshihito Hara, Osaka (JP); Yukinobu Nakata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/745,677

(22) Filed: Jun. 22, 2015

(65) Prior Publication Data

US 2015/0287833 A1 Oct. 8, 2015

Related U.S. Application Data

(62) Division of application No. 13/823,872, filed as application No. PCT/JP2011/072627 on Sep. 30, 2011, now Pat. No. 9,087,752.

(30) Foreign Application Priority Data

Oct. 7, 2010 (JP) ................. 2010-227968

(51) Int. Cl.
  *H01L 27/12* (2006.01)
  *G02F 1/1345* (2006.01)
  (Continued)

(52) U.S. Cl.
  CPC .......... *H01L 27/124* (2013.01); *G02F 1/13458* (2013.01); *G02F 1/136227* (2013.01); *H01L 27/1225* (2013.01); *H01L 27/1255* (2013.01); *H01L 27/1288* (2013.01);
  (Continued)

(58) Field of Classification Search
  None
  See application file for complete search history.

(56) References Cited

U.S. PATENT DOCUMENTS

2007/0072439 A1 3/2007 Akimoto et al.
2008/0303020 A1 12/2008 Shin et al.
(Continued)

FOREIGN PATENT DOCUMENTS

CN 1941299 A 4/2007
KR 10-2008-0104756 A 12/2008
(Continued)

OTHER PUBLICATIONS

Hara et al., "Semiconductor Device, Display Device, and Method for Manufacturing Semiconductor Device and Display Device", U.S. Appl. No. 13/823,872, filed Mar. 15, 2013.

*Primary Examiner* — Daniel Luke
(74) *Attorney, Agent, or Firm* — Keating & Bennett, LLP

(57) ABSTRACT

A semiconductor device (100) according to the present invention includes a thin film transistor (10) having a gate electrode (62a), a first insulating layer (64), an oxide semiconductor layer (66a), a protection layer (68), a source electrode (72as), and a second insulating layer (74). A first connecting portion (30) includes a lower metal layer (72c), an upper metal layer (72c), and an insulating layer (74). A second connecting portion (40) includes a lower metal layer (72d) and an upper conductive layer (17d). A region in which the lower metal layer (72d) is in contact with the upper conductive layer (17d), and a region in which an insulating layer (74) made of a same material as the first insulating layer and a semiconductor layer (66d) made of a same material as the oxide semiconductor layer (66a) are stacked in between the lower metal layer (72d) and the upper conductive layer (17d), are formed in the second connecting portion (40). As a result, a semiconductor device with a higher performance can be provided with a high production efficiency.

10 Claims, 16 Drawing Sheets

(51) Int. Cl.
    *H01L 29/417*    (2006.01)
    *H01L 29/423*    (2006.01)
    *H05B 33/02*     (2006.01)
    *H01L 29/786*    (2006.01)
    *G02F 1/1362*    (2006.01)
    *H01L 27/32*     (2006.01)
(52) U.S. Cl.
    CPC ... *H01L 29/41733* (2013.01); *H01L 29/42384* (2013.01); *H01L 29/7869* (2013.01); *H05B 33/02* (2013.01); *G02F 2001/13629* (2013.01); *G02F 2001/136295* (2013.01); *H01L 27/3262* (2013.01)

(56) References Cited

U.S. PATENT DOCUMENTS

2010/0102313 A1    4/2010   Miyairi et al.
2012/0218485 A1*   8/2012   Chikama ........... G02F 1/136213
                                                                349/39

FOREIGN PATENT DOCUMENTS

TW         201034198 A1    9/2010
WO     WO 2011055474  *    5/2011

* cited by examiner

FIG.15
Prior Art
(a)
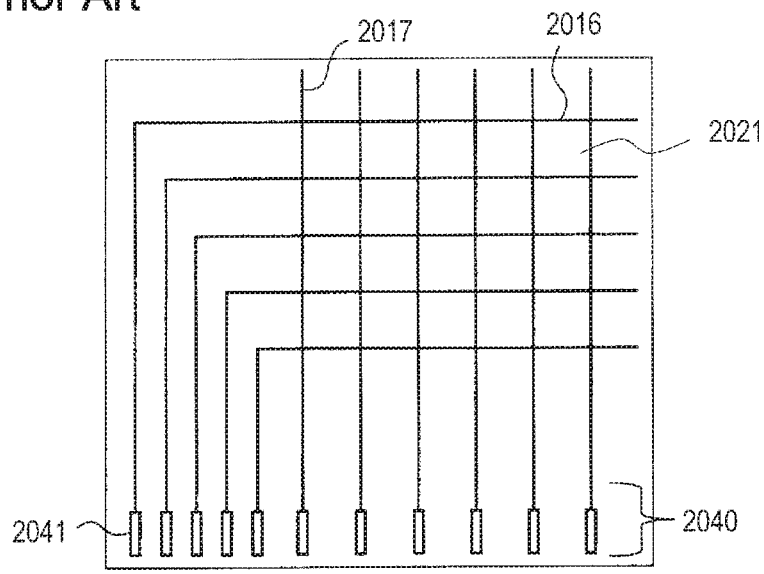
(b)
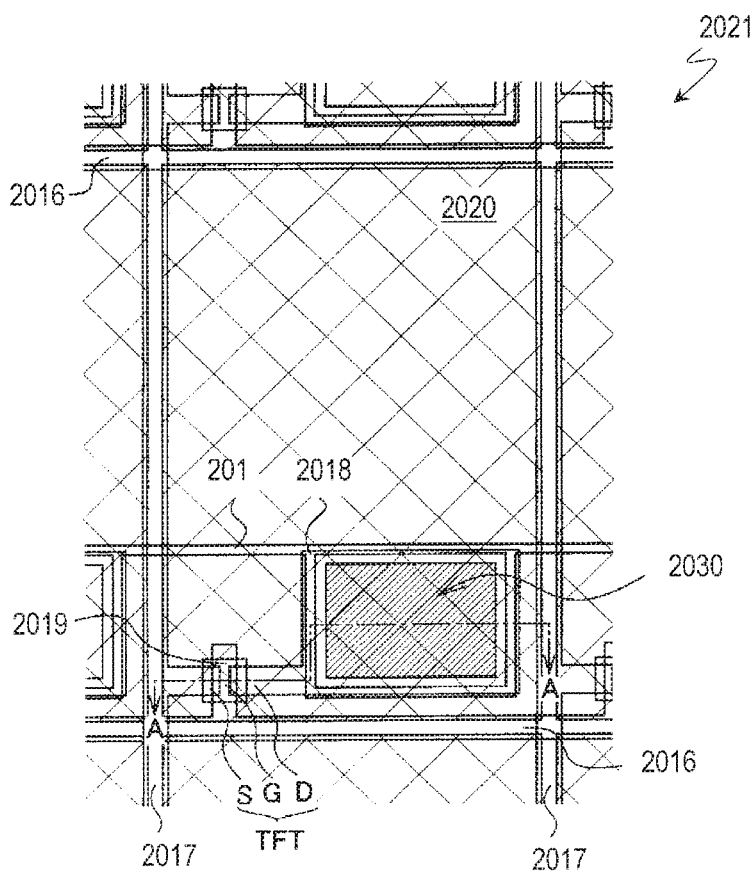

THIN FILM TRANSISTOR WITH INTEGRATED CONNECTING PORTION

TECHNICAL FIELD

The present invention relates to a semiconductor device and display device having a thin film transistor, and a production method for a semiconductor device and display device having a thin film transistor.

BACKGROUND ART

Generally speaking, a liquid crystal display device or an organic EL (Electro Luminescence) display device of an active matrix type includes: a substrate on which a thin film transistor (Thin Film Transistor; hereinafter also referred to as "TFT") is formed as a switching element for each pixel (hereinafter also referred to as "TFT substrate"); a counter substrate on which a counter electrode, color filters, and the like are formed; and an optical modulation layer, e.g., a liquid crystal layer, provided between the TFT substrate and the counter substrate.

On the TFT substrate, a plurality of source lines, a plurality of gate lines, and a plurality of TFTs respectively disposed at intersections therebetween, pixel electrodes for applying a voltage across the optical modulation layer such as a liquid crystal layer, storage capacitor lines and storage capacitor electrodes, and the like are formed. Moreover, at an end portion of the TFT substrate, terminal portions for allowing the source lines and gate lines to be respectively connected to input terminals of a driving circuit are provided. The driving circuit may be formed on the TFT substrate, or on a separate substrate (circuit board).

The construction of a TFT substrate is disclosed in Patent Document 1, for example. Hereinafter, with reference to the drawings, the construction of a TFT substrate disclosed in Patent Document 1 will be described.

FIG. 15(*a*) is a schematic plan view showing the TFT substrate in outline, and the FIG. 15(*b*) is an enlarged plan view showing one pixel of the TFT substrate. FIG. 16 is a cross-sectional view of a TFT and terminal portions of the semiconductor device shown in FIG. 15.

As shown in FIG. 15(*a*), the TFT substrate includes a plurality of gate lines 2016 and a plurality of source lines 2017. Each region 2021 surrounded by these lines 2016 and 2017 defines a "pixel". In a region 2040 of the TFT substrate other than the region (displaying region) where the pixels are formed, a plurality of connecting portions 2041 for allowing the plurality of gate lines 2016 and source lines 2017 to be respectively connected to a driving circuit are provided. Each connecting portion 2041 constitutes a terminal portion for providing connection to external wiring.

As shown in FIG. 15(*b*) and FIG. 16, a pixel electrode 2020 is provided so as to cover each region 2021 defining a pixel. Moreover, a TFT is formed in each region 2021. The TFT includes a gate electrode G, gate insulating films 2025 and 2026 covering the gate electrode G, a semiconductor layer 2019 disposed on the gate insulating film 2026, and a source electrode S and a drain electrode D respectively connected to both end portions of the semiconductor layer 2019. The TFT is covered by a protection film 2028. An interlayer insulating film 2029 is formed between the protection film 2028 and the pixel electrode 2020. The source electrode S of the TFT is connected to a source line 2017, whereas the gate electrode G is connected to a gate line 2016. The drain electrode D is connected to the pixel electrode 2020 within a contact hole 2030.

Moreover, a storage capacitor line 2018 is formed in parallel to the gate line 2016. The storage capacitor line 2018 is connected to a storage capacitor. Herein, the storage capacitor is composed of a storage capacitor electrode 2018*b* which is made of the same conductive film as the drain electrode, a storage capacitor electrode 2018*a* which is made of the same conductive film as the gate line, and the gate insulating film 2026 interposed therebetween.

On the connecting portion 2041 extending from each gate line 2016 or source line 2017, the gate insulating films 2025 and 2026 and the protection film 2028 are not formed, but a connection line 2044 is formed so as to be in contact with an upper face of the connecting portion 2041. As a result, electrical connection between the connecting portion 2041 and the connection line 2044 is ensured.

As shown in FIG. 16, in the liquid crystal display device, the TFT substrate is disposed so as to oppose a substrate 2014 on which a counter electrode and color filters are formed, with a liquid crystal layer 2015 interposed therebetween.

When fabricating such a TFT substrate, the regions 2021 to become pixels (also referred to as "pixel portions") and the terminal portions are preferably formed through a common process, so as to reduce increase in the number of masks and the number of steps.

In order to fabricate the aforementioned TFT substrate, it is necessary to etch away the portions of the gate insulating films 2025 and 2026 and the protection film 2028 that are located in the terminal deployment region 2040, and the portions of the gate insulating film 2025 and the protection film 2028 that are located in the regions where the storage capacitors are to be formed. Patent Document 1 discloses forming an interlayer insulating film 2029 by using an organic insulating film, and by using this as a mask, etching the insulating films 2025 and 2026 and the protection film 2028.

Patent Document 2 describes the construction of a pixel portion of a TFT substrate having channel-protection type TFTs. However, the TFTs in Patent Document 2 are produced by using a silicon film.

FIG. 17 is a cross-sectional view showing a portion of the TFT substrate which is described in Patent Document 2. In each pixel of the TFT substrate, a thin film transistor 1141 and a storage capacitor 1142 are provided. On the thin film transistor 1141 are formed a gate line 1102, a gate insulating film 1104, a semiconductor layer 1113 having a channel-forming region, a channel protection film 1108, a source region 1118, a drain region 1117, a drain electrode 1121, and a source line 1122. The thin film transistor 1141 is covered by a protection film 1127, with a pixel electrode 1131 being provided on the protection film 1127. The pixel electrode 1131 is connected with the drain electrode 1121 within a contact hole which is formed in the protection film 1127. The storage capacitor 1142 is constituted by a capacitor line 1151 (which is made of the same conductive film as the gate line 1102) and the pixel electrode 1131 as the electrodes, and the gate insulating film 1104 and the protection film 1127 interposed between the electrodes as the dielectric.

On the other hand, Patent Document 3 proposes use of halftone masks in a production method of a TFT substrate having channel-protection type TFTs, this being in order to reduce the number of masks to be used. However, the method of Patent Document 3 requires a complicated production process, thus possibly lowering the mass producibility. Moreover, since only one layer of insulating film is formed between the gate electrode and the source/drain electrodes, there is a possibility of short-circuiting between these electrodes.

CITATION LIST

Patent Literature

[Patent Document 1] Japanese Laid-Open Patent Publication No. 2008-170664
[Patent Document 2] Japanese Laid-Open Patent Publication No. 2009-157354
[Patent Document 3] Japanese Laid-Open Patent Publication No. 2007-258675

SUMMARY OF INVENTION

Technical Problem

In the recent years, it has been proposed to form an active layer of a TFT by using an oxide semiconductor film such as zinc oxide, instead of a silicon semiconductor film. Such a TFT is referred to as an "oxide semiconductor TFT".

An oxide semiconductor has higher mobility than does amorphous silicon. Therefore, an oxide semiconductor TFT is able to operate more rapidly than an amorphous silicon TFT.

Moreover, an oxide semiconductor film is formed through simpler processes than those of a polycrystalline silicon film, and therefore is also applicable to devices which require a large area.

However, during the production process of an oxide semiconductor TFT having a bottom-gate structure, carrier electrons may occur due to oxygen defects in a heat treatment step or the like, for example, thus resulting in lower resistance. There is also a problem in that the underlying oxide semiconductor film is susceptible to damage in the steps of etching source/drain electrodes and the step of forming an interlayer insulating film.

On the other hand, a structure (channel-protection type) is conceivable in which a channel protection film is provided so as to cover the region of a semiconductor layer where a channel is to be formed (channel-forming region). In a TFT production process, when forming source/drain electrodes after a channel protection film is formed on the semiconductor layer, the channel protection film functions as an etchstop in performing an etching for forming the source/drain electrodes. As a result, the damage which the channel-forming region receives through etching can presumably be reduced.

However, when such a channel protection film is added, use of a conventional stacking method would make necessary a patterning step which employs a mask for the channel protection film. This causes an increase in production steps, which will likely lower the production efficiency of the semiconductor device.

Moreover, generally speaking, a TFT substrate of a liquid crystal display device or an organic EL display device has a displaying region and a peripheral region (also referred to as "frame region") around it, with a plurality of pixels being arranged in a matrix array in the displaying region, and driving circuits for scanning signal driving and display signal driving being provided in the peripheral region. In a COG (Chip on Glass) type display device, these driving circuits are mounted in the peripheral region of the TFT substrate in the form of electrical elements such as LSIs. Near the boundary between the displaying region and the peripheral region, connecting portions are provided for allowing scanning lines, signal lines, and the like in the displaying region to be connected to connection lines in the peripheral region. In addition to these, terminal portions are generally formed in the neighborhood of the outer edge of the peripheral region, at which elements such as FPCs (flexible printed wiring boards) are to be attached. The connecting portions and the terminal portions are integral with the TFT substrate, and produced at the same time when the TFT substrate is fabricated.

In the connecting portions and the terminal portions, direct electrical connection is made between different conductor lines, e.g., an overlying connection line becoming connected to an underlying connection line, or an underlying connection line becoming connected to an overlying connection line. Since the layer construction of the connecting portions and the terminal portions is different from the layer construction of the TFTs, some adaptation of the construction and production method in each site is necessary in order to efficiently form these sites on the same substrate at the same time.

Especially in the case where an oxide semiconductor TFT is put to a high-performance use, it is desirable to stack an extra channel protection layer, as mentioned above. Therefore, in applying an oxide semiconductor TFT to a COG type display device, even more adaptation is required in order to enhance the production efficiency of the TFT substrate of the display device while guaranteeing performance of the oxide semiconductor.

The present invention has been made in view of the above, and aims to produce a semiconductor device having an oxide semiconductor TFT and a connecting portion, or a semiconductor device having an oxide semiconductor TFT, a connecting portion, and a terminal portion, with a high performance and good production efficiency. The present invention also aims to produce a display device having such a semiconductor device as the TFT substrate, with a high performance and good production efficiency.

Solution to Problem

A production method for a semiconductor device according to the present invention is a production method for a semiconductor device including a thin film transistor and a first connecting portion for electrically connecting the thin film transistor to an external connection line, the production method comprising:

(A) a step of stacking a first metal on a substrate;
(B) a step of patterning the stacked first metal to form a gate electrode of the thin film transistor, and a lower metal layer of the first connecting portion;
(C) a step of forming a first insulating layer on the gate electrode and the lower metal layer;
(D) a step of stacking an oxide semiconductor on the first insulating layer;
(E) a step of patterning the stacked oxide semiconductor to form an oxide semiconductor layer of the thin film transistor, and remove the oxide semiconductor from above the lower metal layer;
(F) a step of stacking a protection layer on the oxide semiconductor layer and the first insulating layer;
(G) a step of forming a mask pattern on the protection layer;
(H) a step of etching the protection layer and the first insulating layer through the mask pattern, with the oxide semiconductor layer serving as an etch stopper, to form a protection layer on a portion of the oxide semiconductor layer and remove the protection layer and the first insulating layer from above the lower metal layer;
(I) a step of stacking a second metal on the protection layer and the lower metal layer; and
(J) a step of patterning the second metal to form a source electrode and a drain electrode of the thin film transistor and form an upper metal layer of the first connecting portion.

In one embodiment, in step (J), a region in which the protection layer and the upper metal layer are stacked on the first insulating layer remains in the first connecting portion.

In one embodiment, the semiconductor device further includes a second connecting portion electrically connected to the first connecting portion via a connection line; at step (B), a lower metal layer of the second connecting portion is formed by patterning the first metal; at step (C), the first insulating layer is formed on the lower metal layer of the second connecting portion; at step (E), a first semiconductor layer is formed on the first insulating layer in the second connecting portion by patterning the oxide semiconductor; at step (F), the protection layer is stacked on the first semiconductor layer; at step (H), the protection layer is removed from above a portion of the first semiconductor layer by etching the protection layer through the mask pattern, with the first semiconductor layer serving as an etch stopper; at step (J), by patterning the second metal, the second metal in the second connecting portion is removed, and a portion of the first semiconductor layer is removed.

In one embodiment, at step (J), a portion of the first semiconductor layer remains on a portion of the first insulating layer in the second connecting portion.

In one embodiment, the production method further comprises a step of forming an upper conductive layer on the lower metal layer in the second connecting portion and on the remaining portion of the first semiconductor layer.

In one embodiment, the semiconductor device further includes a terminal portion for electrically connecting the thin film transistor with external wiring via the first connecting portion and the second connecting portion; at step (B), a lower metal layer of the terminal portion is formed by patterning the first metal; at step (C), the first insulating layer is formed on the lower metal layer of the terminal portion; at step (E), a second semiconductor layer is formed on the first insulating layer in the terminal portion by patterning the oxide semiconductor; at step (F), the protection layer is stacked on the second semiconductor layer; at step (H), the protection layer is etched through the mask pattern, with the second semiconductor layer serving as an etch stopper, to form a protection layer on a portion of the second semiconductor layer; and at step (J), by patterning the second metal, the second metal in the terminal portion is removed, and a portion of the second semiconductor layer is removed.

In one embodiment, at step (J), a portion of the second semiconductor layer remains in the first insulating layer of the terminal portion.

In one embodiment, the production method further comprises a step of forming an upper conductive layer on the lower metal layer of the terminal portion and on the remaining portion of the second semiconductor layer.

In one embodiment, at step (H), a surface of the oxide semiconductor is made conductive through a plasma etching treatment.

A production method for a display device according to the present invention is a production method for a display device comprising the production method for the above semiconductor device, the production method further comprising:

(K) a step of forming a second insulating layer on the source electrode, the drain electrode, and the upper metal layer of the first connecting portion; and (L) a step of stacking a conductive film on the second insulating layer, and patterning the conductive film to form a pixel electrode.

In embodiment, the display device further includes a storage capacitor disposed in the pixel; at step (B), a first capacitor electrode of the storage capacitor is formed by patterning the first metal; at step (C), the first insulating layer is formed on the first capacitor electrode; at step (E), a third semiconductor layer is formed on the first insulating layer in the storage capacitor by patterning the oxide semiconductor; at step (J), a second capacitor electrode is formed so as to be in contact with the third semiconductor layer by patterning the second metal; at step (K), the second insulating layer on the second capacitor electrode is selectively removed to form a contact hole; and at step (L), the conductive film is stacked so as to be in contact with the second capacitor electrode within the contact hole, the second capacitor electrode becoming electrically connected to the pixel electrode.

A semiconductor device according to the present invention is a semiconductor device comprising a thin film transistor and a first connecting portion for electrically connecting the thin film transistor to external wiring, the thin film transistor including: a gate electrode; a first insulating layer formed on the gate electrode; an oxide semiconductor layer formed on the first insulating layer; a protection layer disposed in contact with the oxide semiconductor layer; a source electrode and a drain electrode formed on the protection layer so that a portion of each is in contact with the oxide semiconductor layer; and a second insulating layer formed on the source electrode and the drain electrode, the first connecting portion including: a lower metal layer made of a same material as the gate electrode; an upper metal layer formed so as to be in contact with the lower metal layer, the upper metal layer formed being made of a same material as the source electrode and the drain electrode; and an insulating layer formed on the upper metal layer, the insulating layer being made of a same material as the second insulating layer, wherein a region in which the upper metal layer, a layer made of a same member as the protection layer of the thin film transistor, and the upper metal layer are stacked is formed in the first connecting portion.

In one embodiment, the semiconductor device further comprises a second connecting portion electrically connected to the first connecting portion via a connection line, the second connecting portion including a lower metal layer made of a same material as the gate electrode and an upper conductive layer formed on the lower metal layer of the second connecting portion, wherein a region in which the lower metal layer and the upper conductive layer of the second connecting portion are in contact, and a region in which an insulating layer made of a same material as the first insulating layer and a semiconductor layer made of a same material as the oxide semiconductor layer are stacked in between the lower metal layer and the upper conductive layer of the second connecting portion, are formed in the second connecting portion.

In one embodiment, the semiconductor device comprises a terminal portion for electrically connecting the thin film transistor to external wiring via the first connecting portion and the second connecting portion, the terminal portion including a lower metal layer made of a same material as the gate electrode and an upper conductive layer formed on the lower metal layer of the terminal portion, wherein a region in which the lower metal layer and the upper conductive layer of the terminal portion are in contact, and a region in which an insulating layer made of a same material as the first insulating layer and a semiconductor layer made of a same material as the oxide semiconductor layer are stacked in between the lower metal layer and the upper conductive layer of the terminal portion, are formed in the terminal portion.

In one embodiment, a surface of each of the oxide semiconductor layer of the thin film transistor, the semiconductor layer of the second connecting portion, and the semiconductor layer of the terminal portion is made conductive through a plasma etching treatment.

A display device according to the present invention is a display device comprising the above semiconductor device, the display device including: a plurality of pixels arranged in a matrix array; and a pixel electrode formed on the second insulating layer within a pixel, wherein the pixel electrode is electrically connected to the drain electrode of the thin film transistor; and the upper conductive layer of the second connecting portion is made of a same material as the pixel electrode.

In one embodiment, the display device comprises a storage capacitor disposed within a pixel, the storage capacitor including: a first capacitor electrode made of a same material as the gate electrode; an insulating layer formed on the first capacitor electrode, the insulating layer being made of a same material as the first insulating layer; a semiconductor layer formed on the insulating layer of the storage capacitor, the semiconductor layer being made of a same material as the oxide semiconductor layer; and a second capacitor electrode formed on the semiconductor layer of the storage capacitor, the second capacitor electrode being made of a same material as the drain electrode.

In one embodiment, the second capacitor electrode of the storage capacitor is in electrical contact with the pixel electrode within an opening formed in the second insulating layer.

In one embodiment, the display device includes a display section containing a plurality of pixels arranged in a matrix array and a peripheral portion disposed outside the display section; an electrical element for controlling displaying by the display section is disposed in the peripheral portion; and the thin film transistor and the electrical element in the peripheral portion are electrically connected via the first connecting portion and the second connecting portion.

In one embodiment, the terminal portion is a terminal disposed in the peripheral portion for attaching a flexible printed wiring board.

Advantageous Effects of Invention

According to the present invention, a high-performance semiconductor device having an oxide semiconductor TFT and a connecting portion, and a high-performance semiconductor device having an oxide semiconductor TFT, a connecting portion, and a terminal portion can be provided with a good production efficiency. Moreover, according to the present invention, a high-performance display device having such a semiconductor device as the TFT substrate can be provided with a good production efficiency.

BRIEF DESCRIPTION OF DRAWINGS

FIG. 15 (a) is a schematic plan view generally showing a conventional TFT substrate; and (b) is an enlarged plan view showing one pixel of the TFT substrate of (a).

DESCRIPTION OF EMBODIMENTS

Hereinafter, with reference to the drawings, semiconductor devices and display devices according to embodiments of the present invention, and production methods for the semiconductor devices and display devices, will be described. However, the scope of the invention is not to be limited to the following embodiments.

(Embodiment 1)

Figure 1:
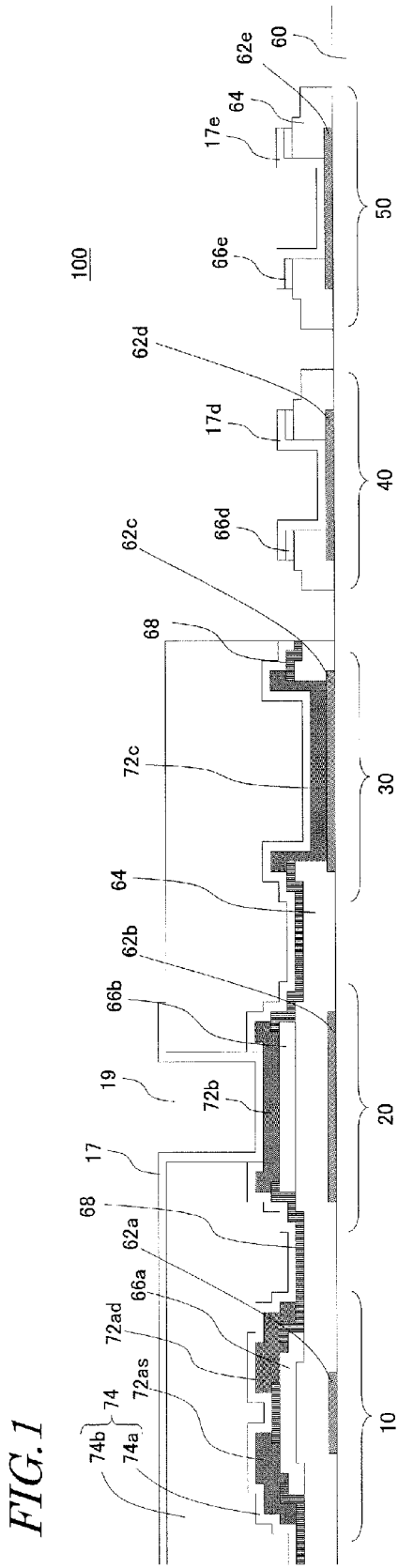
FIG. 1 A cross-sectional view showing the construction of a semiconductor device 100 according to Embodiment 1 of the present invention.

FIG. 1 is a cross-sectional view schematically showing the construction of a semiconductor device according to Embodiment 1.

The semiconductor device of the present embodiment is a TFT substrate on which an oxide semiconductor TFT is formed, and broadly encompasses TFT substrates of various display devices, electronic devices, and the like. However, in the description of the present embodiment, the semiconductor device will be illustrated as a TFT substrate of a liquid crystal display device having oxide semiconductor TFTs as switching elements.

A semiconductor device 100 of the present embodiment (which may also be referred to as the "TFT substrate 100") includes: a thin film transistor 10; and a first connecting portion 30, a second connecting portion 40, and a terminal portion 50 for electrically connecting the thin film transistor 10 with external wiring. Details of the first connecting portion 30, the second connecting portion 40, and the terminal portion 50 will be described later. Furthermore, the semiconductor device 100 includes a storage capacitor portion (referred to as the "storage capacitor 20") for providing storage capacitance when used as a TFT substrate of a display device. It is intended that any implementation which lacks the storage capacitor 20 is also encompassed within the semiconductor device according to the present invention.

The thin film transistor 10 includes: a gate electrode 62a; a first insulating layer 64 formed on the gate electrode 62a ("gate insulating layer 64", or may be simply referred to as "insulating layer 64"); an oxide semiconductor layer 66a formed on the first insulating layer 64; a protection layer 68 provided in contact with the oxide semiconductor layer 66a; a source electrode 72as and a drain electrode 72ad formed on the protection layer 68 so that a portion of each is in contact with the oxide semiconductor layer 66a via gaps in the protection layer 68; and a second insulating layer 74 (which may be simply referred to as the "insulating layer 74") formed on the source electrode 72as and drain electrode 72ad.

The second insulating layer 74 is composed of a protection film 74a which is formed to be in contact with the source electrode 72as and drain electrode 72ad, and an interlayer insulating film 74b which is formed on the protection film 74a. The second insulating layer 74 may be formed of a single layer. On the second insulating layer 74, a conductive layer (called a "pixel electrode 17") capable of functioning as a pixel electrode of the display device is formed.

The storage capacitor 20 includes: a first capacitor electrode (storage capacitor electrode) 62b being made of the same metal material as the gate electrode 62a; an insulating layer 64 being formed on the first capacitor electrode 62b and made of the same material as the second insulating layer 64; a semiconductor layer 66b being formed on the insulating layer 64 and made of the same material as the oxide semiconductor layer 66a; and a second capacitor electrode (storage capacitor counter electrode) 72b being formed on the semiconductor layer 66b and made of the same material as the source electrode 72as and the drain electrode 72ad. The insulating layer 74 is formed on the second capacitor electrode 72b. A contact hole (opening) 19 is formed in the insulating layer 74 over the storage capacitor 20, with a pixel electrode 17 (herein, what is referred to as the pixel electrode 17 is inclusive also of the conductor layer that extends from the pixel electrode 17) being stacked in the contact hole 19, and with the second capacitor electrode 72b being electrically connected to the pixel electrode 17 inside the contact hole 19.

The first connecting portion 30 includes: a lower metal layer 62c being made of the same material as the gate electrode 62a; an upper metal layer 72c being formed to be in contact with the lower metal layer 62c within a gap in the insulating layer 64 and made of the same material as the source electrode 72as and the drain electrode 72ad; and an insulating layer 74 being formed on the upper metal layer 72c and made of the same material as the second insulating layer 74. There is a region in a portion of the first connecting portion 30 where the insulating layer 64, the protection layer 68, and the upper metal layer 72c are stacked.

The second connecting portion 40 includes: a lower metal layer 62d being made of the same material as the gate electrode 62a; and an upper conductive layer 17d being formed to be in contact with the lower metal layer 62d within a gap in the insulating layer 64. The upper conductive layer 17d is made of the same material as the pixel electrode 17. The second connecting portion 40 includes: a region in which the lower metal layer 62d is in contact with the upper conductive layer 17d; and a region in which the insulating layer 64 and a semiconductor layer 66d being made of the same material as the oxide semiconductor layer 66a are stacked in between the lower metal layer 62d and the upper conductive layer 17d outside the former region.

The terminal portion 50 includes: a lower metal layer 62e being made of the same material as the gate electrode 62a; and an upper conductive layer 17e being formed to be in contact with the lower metal layer 62e within the gap in the insulating layer 64. The upper conductive layer 17e is made of the same material as the pixel electrode 17. The terminal portion 50 includes: a region in which the lower metal layer 62e is in contact with the upper conductive layer 17e; and a region in which the insulating layer 64 and a semiconductor layer 66e being made of the same material as the oxide semiconductor layer 66a are stacked in between the lower metal layer 62e and the upper conductive layer 17e outside the former region.

In the thin film transistor 10, the surface of the portions of the oxide semiconductor layer 66a and the semiconductor layers 66b, 66d, and 66e which are not covered by the protection layer 68 may be made conductive during a plasma etching in the production steps, or by additionally introducing a plasma treatment.

(Embodiment 2)

Figure 2:
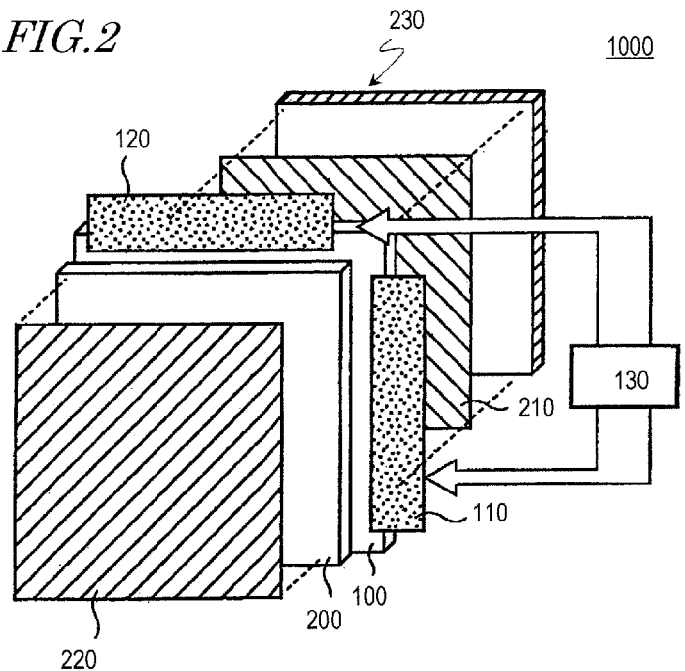
FIG. 2 A perspective view schematically showing the construction of a liquid crystal display device 1000 according to Embodiment 2 of the present invention.

FIG. 2 is a perspective view schematically showing the construction of a liquid crystal display device 1000 according to Embodiment 2 of the present invention.

As shown in FIG. 2, the liquid crystal display device 1000 include: a TFT substrate 100 (corresponding to the semiconductor device 100 of Embodiment 1) and a counter substrate 200, which oppose each other with a liquid crystal layer interposed therebetween; polarizers 210 and 220 provided respectively outside the TFT substrate 100 and the counter substrate 200; and a backlight unit 230 which emits light for displaying toward the TFT substrate 100. On the TFT substrate 100, a scanning line driving circuit 110 for driving a plurality of scanning lines (gate bus lines) and a signal line driving circuit 120 for driving a plurality of signal lines (data bus lines) are disposed. The scanning line driving circuit 80 and the signal line driving circuit 82 are connected to a control circuit 130 which is external to the TFT substrate 100. Under control of the control circuit 130, scanning signals for switching the TFTs ON/OFF are supplied from the scanning line driving circuit 110 to the plurality of scanning lines, and display signals (applied voltages to the pixel electrodes 17) are supplied from the signal line driving circuit 120 to the plurality of signal lines.

The counter substrate 200 includes color filters and a common electrode. In the case of displaying in three primary colors, the color filters include an R (red) filter, a G (green) filter, and a B (blue) filter each provided corresponding to a pixel. The common electrode is formed so as to cover the plurality of pixel electrodes 17, with the liquid crystal layer interposed therebetween. In accordance with a potential difference applied between the common electrode and each pixel electrode 17, the liquid crystal molecules between the electrodes become aligned for the respective pixel, whereby displaying is performed.

Figure 3:
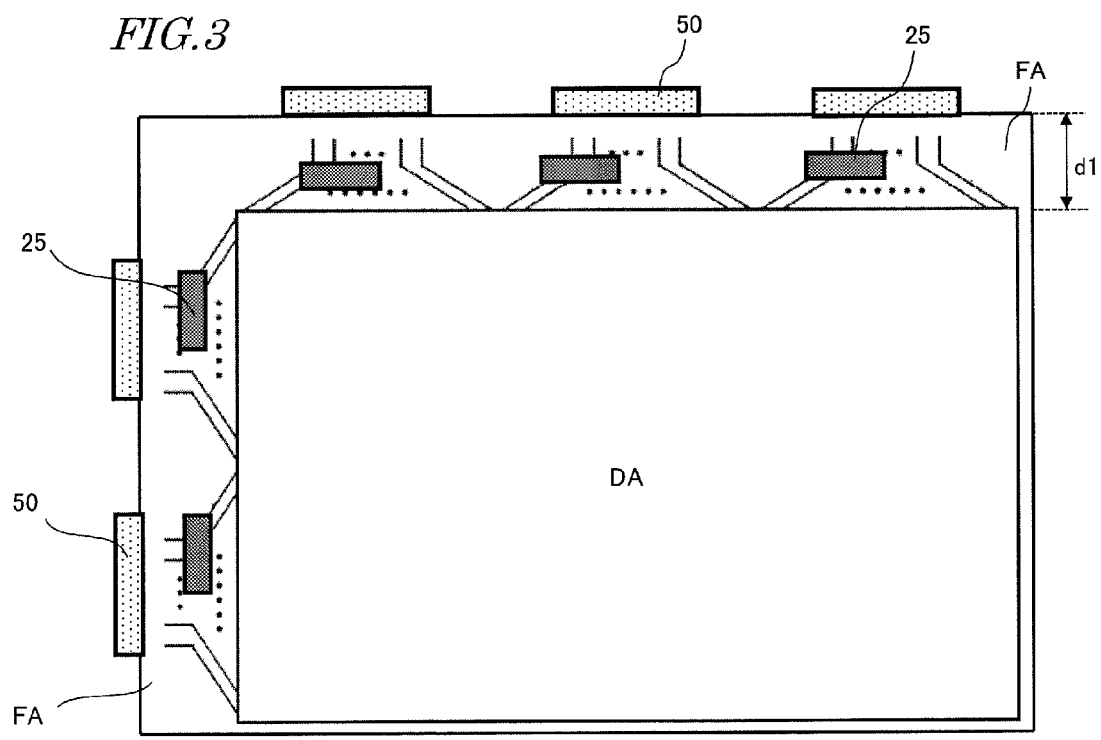
FIG. 3 A plan view schematically showing the construction of a TFT substrate (semiconductor device 100) of the liquid crystal display device 1000.
Figure 4:
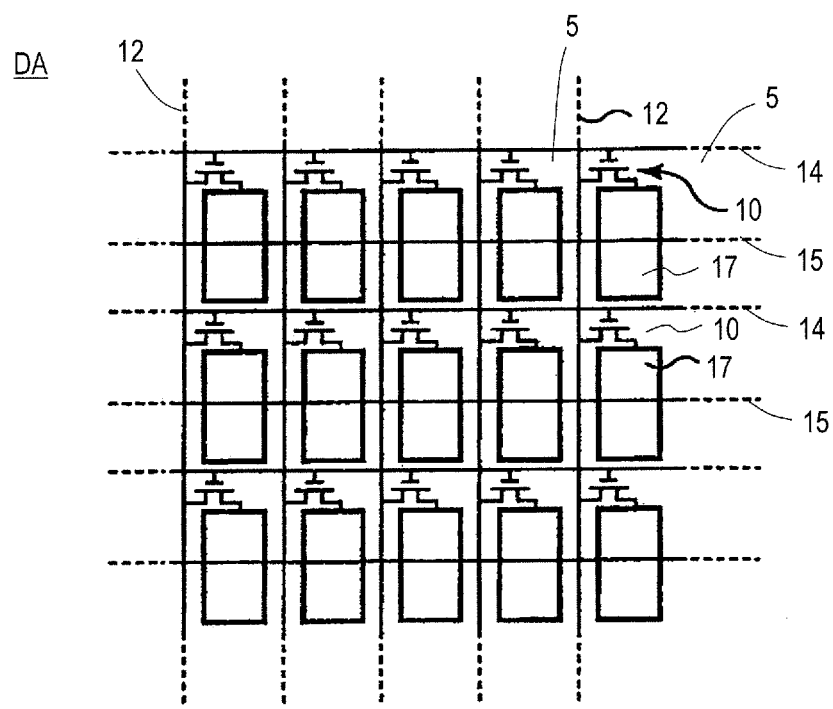
FIG. 4 A plan view schematically showing the construction of a displaying region DA of the TFT substrate 100.

FIG. 3 is a plan view schematically showing the construction of the TFT substrate 100; FIG. 4 is a plan view schematically showing the construction of a displaying region DA of the TFT substrate 100; and FIG. 5 is a plan view schematically showing a wiring construction on the TFT substrate.

As shown in FIG. 3, there are a display section DA and a peripheral portion FA located outside the display section. In the peripheral portion FA, electrical elements 25 such as the scanning line driving circuit 110, the signal line driving circuit 120, and voltage supply circuits are disposed in COG fashion. Moreover, terminal portions 50 are provided near outer ends of the peripheral portion FA for attaching external devices, e.g., FPCs.

As shown in FIG. 4, a plurality of pixels 5 are arranged in a matrix array in the display section DA, and a plurality of scanning lines 14 and a plurality of signal lines 12 are disposed orthogonal to one another. Near each of the intersections between the plurality of scanning lines and the plurality of signal lines 12, a thin film transistor (TFT) 10 is formed as an active element for each pixel 5. In each pixel 5, a pixel electrode 17 which is made of e.g. ITO (Indium Tin Oxide) is disposed, the pixel electrode 17 being electrically connected to the drain electrode of the TFT 10. Moreover, between any two adjacent scanning lines 14, a storage capacitor line (also referred to as a Cs line) 15 extends in parallel to the scanning lines 14. The gate electrode 62a of the TFT 10 and the first capacitor electrode 62b of the storage capacitor 20 are formed as part of a scanning line 14 and a storage capacitor line 15, respectively.

Figure 5:
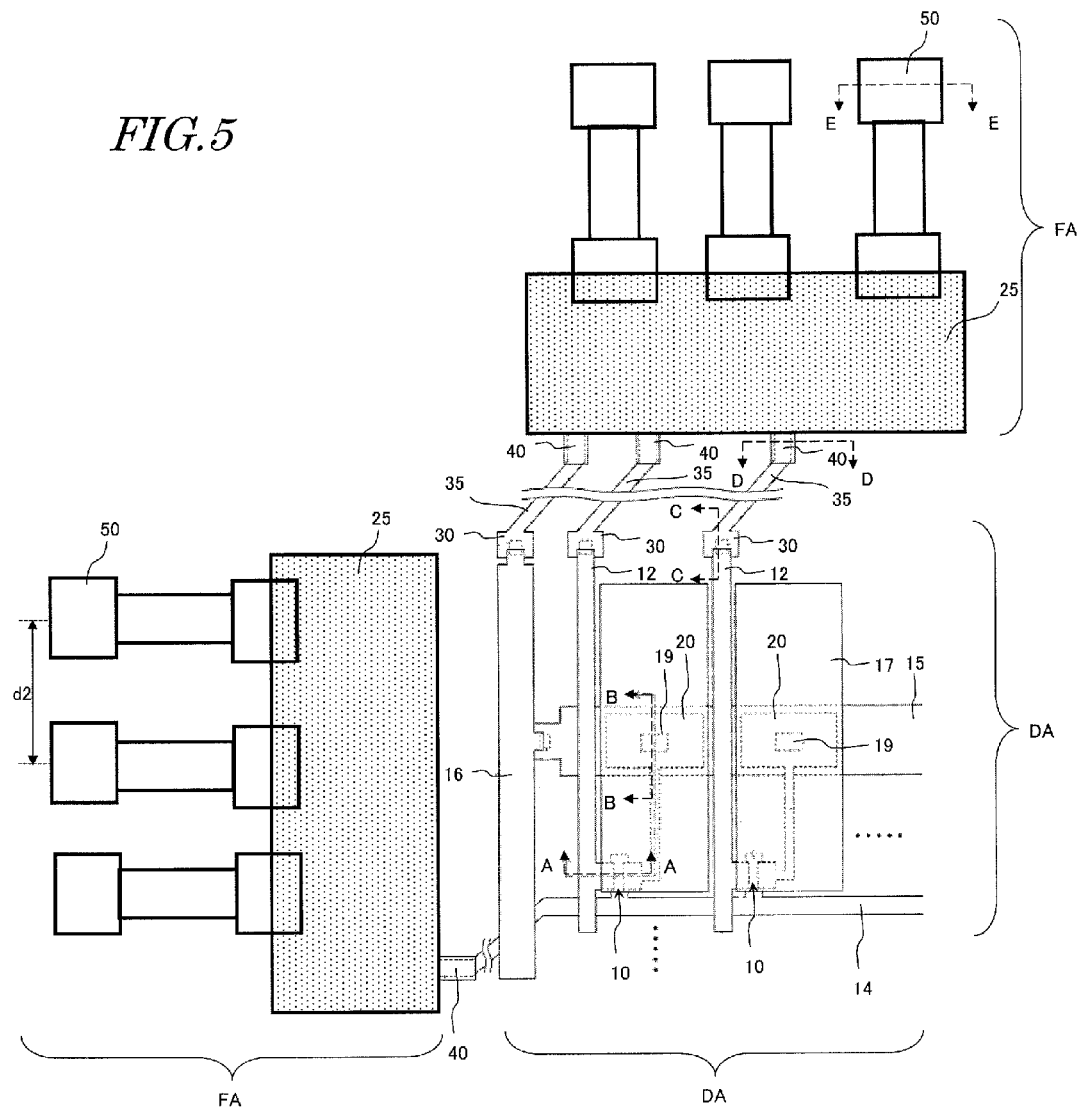
FIG. 5 A plan view schematically showing a wiring construction on the TFT substrate 100.

As shown in FIG. 5, a plurality of connection lines 35 are disposed at a boundary between the displaying region DA and the peripheral region FA. The signal lines 12 and a storage capacitor connection line 16 which is connected to the storage capacitor line 15 are electrically connected to the connection lines 35 respectively via connecting portions 30 which are correspondingly disposed. Via each connecting portion 30, a signal line 12 or the storage capacitor connection line 16, as an overlying connection line, is connected to the connection line 35 as an underlying connection line. Note that the storage capacitor connection line 16 is connected to the storage capacitor line 15, which is an underlying connection line, via a contact hole which is formed in the insulating layer 64. Moreover, the drain electrode of each TFT 10 is connected to the second capacitor electrode, which is an upper electrode of the storage capacitor 20, the second capacitor electrode being connected to the pixel electrode 17 via a contact hole which is formed in the insulating layer existing between the pixel electrode and the second capacitor electrode.

On the peripheral region FA side of each connection line 35, a connecting portion 40 is provided. At the connecting portion 40, the connection line 35 is connected to an overlying connection line in the peripheral region FA, the overlying connection line being connected to the electrical element 25. Moreover, the scanning line 14, as an underlying connection line, is also connected via a connecting portion 40 to an overlying connection line in the peripheral region, and thereafter connected to an electrical element 25. Each electrical element 25 and the terminal portions 50 are connected via a plurality of lines.

Next, a production method for the TFT substrate 100 will be described with reference to FIGS. 6 to 8.

FIGS. 6(a) to (e), FIGS. 7(f) to (i), and FIGS. 8(j) to (l) are schematic cross-sectional views showing production steps (A) to (L) of the TFT substrate 100. In FIG. 6 to FIG. 8, cross sections of a thin film transistor (TFT) 10, a storage capacitor 20, a first connecting portion 30, a second connecting portion 40, and a terminal portion 50 respectively correspond to an A-A cross section, a B-B cross section, a C-C cross section, a D-D cross section, and an E-E cross section in FIG. 5.

Step (A):

First, as shown in FIG. 6(a), a first metal 62 is stacked on a substrate 60 by sputtering technique or the like. The first metal 62 may be a metal layer which is composed of three layers of Ti(titanium)/Al(aluminum)/Ti(titanium), for example.

Step (B):

Next, as shown in FIG. 6(b), the stacked first metal 62 is patterned, thereby forming a gate electrode 62a of the thin film transistor 10, a first metal layer 62b of the storage capacitor 20, and lower metal layers 62c, 62d, and 62e of the first connecting portion 30, the second connecting portion 40, and the terminal portion 50. The patterning is conducted by, after forming a resist mask (first mask) by a known photolithography technique, removing portions of the first metal 62 that are not covered by the resist mask. The resist mask is removed after the patterning.

Step (C):

Next, as shown in FIG. 6(c), on the substrate 60, a first insulating layer 64 is stacked so as to cover the gate electrode 62a, the first metal layer 62b, and the lower metal layers 62c, 62d, and 62e. The first insulating layer 64 is an $SiO_2$ film having a thickness of about 400 nm, for example, and is formed by CVD technique. The first insulating layer 64 may be a single layer of $SiO_2$ film, for example, or have a multilayer structure having a lower layer of SiNx film and an upper layer of $SiO_2$ film. In the case of a single layer of $SiO_2$ film, the thickness of the $SiO_2$ film is preferably no less than 300 nm and no more than 500 nm. In the case where it has a multilayer structure composed of a SiNx film (lower layer) and an $SiO_2$ film (upper layer), the thickness of the SiNx film is preferably no less than 200 nm and no more than 500 nm, and the thickness of the $SiO_2$ film is preferably no less than 20 nm and no more than 150 nm.

Step (D):

Next, as shown in FIG. 6(d), an oxide semiconductor 66 is stacked on the first insulating layer 64. The oxide semiconductor 66 is formed with a sputtering technique, e.g. by stacking an In—Ga—Zn—O type semiconductor (IGZO) film to a thickness from 30 nm and 300 nm.

Step (E):

Next, as shown in FIG. 6(e), the stacked oxide semiconductor 66 is patterned to obtain an oxide semiconductor layer 66a of the thin film transistor 10, and semiconductor layers 66b (third semiconductor layer), 66d (first semiconductor layer), and 66e (second semiconductor layer) of the storage capacitor 20, the second connecting portion 40, and the terminal portion 50. At this time, in the first connecting portion 30, the oxide semiconductor is removed from above the lower metal layer 62c and the insulating layer 64. By photolithography technique, the patterning is conducted by covering predetermined regions of the oxide semiconductor 66 with a resist mask (a second mask), and removing the portions that are not covered by the resist mask by wet etching. Thereafter, the resist mask is removed. Note that any other type of oxide semiconductor film may be used for the oxide semiconductor 66, instead of IGZO.

Step (F):

Next, as shown in FIG. 7(f), upon the first insulating layer 64, a protection layer 68 of e.g. $SiO_2$ is stacked to a thickness of about 150 nm by CVD technique so as to cover the oxide semiconductor layer 66a and the semiconductor layers 66b, 66d, and 66e. The protection layer 68 preferably contains an oxide such as SiOy. Use of an oxide makes it possible, when oxygen defects occur in the oxide semiconductor layer 66a, to remedy the oxygen defects with the oxygen contained in the oxide, whereby the oxidation defects in the oxide semiconductor layer 66a can be effectively decreased.

Although a single layer of $SiO_2$ is stacked as the protection layer 68 herein, a multilayer structure may be adopted with a lower layer of $SiO_2$ film and an upper layer of SiNx film. The thickness of the protection layer 68 (or the total thickness of the respective layers in the case of a multilayer structure) is preferably no less than 50 nm and no more than 200 nm. When it is 50 nm or more, the surface of the oxide semiconductor layer 66a can be protected with greater certainty at patterning steps of the source/drain electrodes and the like. On the other hand, if it exceeds 200 nm, larger level differences occurring in the source electrode and the drain electrode may cause line breaking or the like, which is not preferable.

Step (G):

Next, as shown in FIG. 7(g), a mask pattern 70 (third mask) is formed on the protection layer 68 by photolithography technique.

Step (H):

Next, as shown in FIG. 7(h), through the mask pattern 70, the protection layer 68 and the first insulating layer 64 are etched. At this time, the oxide semiconductor layer 66a and the semiconductor layers 66b, 66d, and 66e are used as etch stoppers. Through this etching, a protection layer 68 is selectively formed upon the oxide semiconductor layer 66a and the semiconductor layers 66b, 66d, and 66e. At this time, the surface of the oxide semiconductor layer 66a and the semiconductor layers 66b, 66d, and 66e may be made conductive through a plasma etching treatment.

At this step, etching conditions are chosen so that the oxide semiconductor layer 66a is not etched. Therefore, for example, $CF_4/O_2$ (flow rate: 475 sccm/25 sccm) is used as the etching gas, and dry etching is conducted in a chamber by setting the temperature of the substrate at 60° C. The degree of vacuum within the chamber is 15 mT; the applied power is 1000 W; and the etching time is 7 minutes.

As a result of this, in the TFT 10, portions of the protection layer 68 which a source contact and a drain contact are to be formed are removed, whereby two openings through which the oxide semiconductor layer 66a is exposed are formed. The protection layer 68 covers the region of the oxide semiconductor layer 66a to become a channel, and functions as a channel protection film. In the storage capacitor 20, a large part of the protection layer 68 that is located above the semiconductor layer 66b is removed, whereby an opening exposing the semiconductor layer 66b is formed. The diameter of the opening is 20 μm, for example. In the first connecting portion 30, the protection layer 68 and the first insulating layer 64 are removed from above the lower metal layer 62c, thereby exposing the lower metal layer 62c.

In the second connecting portion 40, a portion of the protection layer 68 is removed, thereby partially exposing the semiconductor layer 66d. In the terminal portion 50, a portion of the protection layer 68 is removed, thereby partially exposing the semiconductor layer 66e.

In this step, etching conditions are preferably selected in accordance with the materials of the protection layer 68 and the first insulating layer 64, etc., such that etching occurs with the oxide semiconductor layer 66a serving as an etch stopper. As a result, in the first connecting portion 30, the first insulating layer 64 and the protection layer 68 are etched at one time (GI/ES simultaneous etching), and, at the same time, only the insulating layer 68 is etched in the TFT 10, the storage capacitor 20, the second connecting portion 40, and the terminal portion 50. As used herein, etching conditions include, in the case of employing dry etching, the type of etching gas, the temperature of the substrate 1, the degree of vacuum within the chamber, and so on. In the case of employing wet etching, the type of etchant, the etching time, and so on are included.

Step (I):

Next, as shown in FIG. 7(i), a second metal 72, which is an electrically conductive material, is stacked on the substrate so as to cover the protection layer 68, the oxide semiconductor layer 66a, the semiconductor layers 66b, 66d, and 66e, and the lower metal layer 62. Herein, three layers of MoN/Al/MoN are stacked by sputtering technique, for example.

Step (J):

Next, as shown in FIG. 8(j), the second metal 72 is pattered by using a mask pattern (fourth mask), via photolithography technique. As a result, a source electrode 72as and a drain electrode ad of the TFT 10 are formed so as to be in contact with the oxide semiconductor layer 66a. At this time, in the storage capacitor 20, a second capacitor electrode 72b is formed so as to be in contact with the semiconductor layer 66b; and, in the first connecting portion 30, an upper metal layer 72c is formed so as to be in contact with the lower metal layer 62c. The first connecting portion 30 is left with a region where the protection layer 68 and the upper metal layer 72c are stacked over the insulating layer 64.

Moreover, the entire second metal 72 within the second connecting portion 40 is removed, and also the semiconductor layer 66d in any portion that is not covered by the protection layer 68 is selectively removed. That is, in the second connecting portion 40, the semiconductor layer 66d and the protection layer 68 are left only partially on the insulating layer 64. In the terminal portion 50, the entire second metal 72 is removed, and also the semiconductor layer 66e in any portion that is not covered by the protection layer 68 is selectively removed. That is, in the terminal portion 50, the semiconductor layer 66e and the protection layer 68 are left only partially on the insulating layer 64.

In this manner, the TFT 10, which is an oxide semiconductor TFT, and the storage capacitor 20, which is a storage capacitor Cs, are completed. There is a possibility that the surface of the oxide semiconductor layer 66a and the semiconductor layers 66b, 66d, and 66e may become electrically conductive due to damage from the dry etching. In that case, the storage capacitor 20 will be constituted by the first capacitor electrode 62b as a storage capacitor electrode, the now-conductive semiconductor layer 66b and the second capacitor electrode as a storage capacitor counter electrode, and the insulating layer 64 as a dielectric layer.

Step (K):

Next, as shown in FIG. 8(k), a second insulating layer 74 is formed on the TFT 10, the storage capacitor 20, and the first connecting portion 30. In this step, first, an oxide such as $SiO_2$ is deposited over the entire substrate by CVD technique, and thereafter an SiNx film is deposited, thereby forming the protection film 74a and the interlayer insulating layer 74b. Note that the second insulating layer 74 may be formed as a single layer of $SiO_2$, for example, or as a double structure of an $SiO_2$ layer and an SiNx layer, for example. In the case of a single layer of $SiO_2$, the thickness of the $SiO_2$ layer is preferably no less than 50 nm and no more than 300 nm. In the case of a double structure, the thickness of $SiO_2$ is preferably no less than 50 nm and no more than 150 nm, and the thickness of SiNx is preferably no less than 50 nm and no more than 200 nm.

Next, through photolithography, the second insulating layer 74 is patterned by using a mask pattern (fifth mask). As a result of this, the second insulating layer 74 is left over the TFT 10 and the first connecting portion 30, and the second insulating layer 74 is removed from above the second connecting portion 40 and the terminal portion 50. At this time, the protection layer 68 is removed from above the second connecting portion 40 and the terminal portion 50, and furthermore the portions of the insulating layer 64 that are not covered by the semiconductor layers 66d and 66e is removed, whereby the lower metal layers 62d and 62e are exposed.

Moreover, in the storage capacitor 20, a contact hole 19 is formed by removing the second insulating layer 74 over the second capacitor electrode 72b, inside which the second capacitor electrode 72b becomes exposed.

Step (L):

Next, as shown in FIG. 8(l), a pixel electrode 17, and upper conductive layers 17d and 17e are formed. Herein, a transparent electrically conductive material (conductive film) is first deposited over the entire substrate by sputtering technique, for example. At this time, the transparent electrically conductive material is to be deposited so as to be in contact with the second capacitor electrode 72b of the storage capacitor 20 within the contact hole 19. For example, ITO (thickness: 50 to 200 nm) is used as the transparent electrically conductive material. Next, via known photolithography, the ITO film is pattered by using a mask pattern (sixth mask). As a result of this, a pixel electrode is formed in the pixel 5, and the upper conductive layers 17d and 17e of the second connecting portion 40 and the terminal portion 50 are formed.

In the storage capacitor 20, the pixel electrode 17 is electrically connected to the second capacitor electrode 72b within the contact hole 19. As shown in FIG. 5, the second capacitor electrode 72b is electrically connected to the drain electrode 72ad of the TFT 10. Moreover, an upper conductive layer 17d is formed so as to be in contact with the lower metal layer 62d and the semiconductor layer 66d of the second connecting portion 40, and an upper conductive layer 17e is formed so as to be in contact with the lower metal layer 62e and the semiconductor layer 66e of the terminal portion 50.

In the TFT substrate 100 produced by the aforementioned method, the terminal portion 50 has the following structure. The terminal portion 50 includes: the lower metal layer 62e being disposed on the substrate 60; the first insulating layer 64 being formed on the lower metal layer 62e, and having an opening through which a portion of the lower metal layer 62e is exposed; and the upper conductive layer 17e being formed on the first insulating layer 64 and connected to the lower metal layer 62e within the opening of the first insulating layer 64. Moreover, at the perimeter of the opening in the first insulating layer 64, the semiconductor layer 66e made of oxide semiconductor is interposed between the first insulating layer 64 and the upper conductive layer 17e. It is preferable that the semiconductor layer 66e overlaps the lower metal layer 62e when viewed from the normal direction of the substrate 60.

This allows not only the first insulating layer 64 but also the semiconductor layer 66e to be present between the upper conductive layer 17e and the lower metal layer 62e, whereby the reliability of the terminal portion 50 can be improved.

In the illustrated example, an end of the semiconductor layer 66e at the opening side is aligned with the side wall of the opening of the first insulating layer 64. This is because, at the step shown in FIG. 8(k), the opening was formed as the first insulating layer 64 was etched while the semiconductor layer 66e served as an etching mask. Moreover, the opposite end of the semiconductor layer 66e from the opening may be aligned with the end of the upper conductive layer 17e. Such a structure can be obtained by concurrently etching the semiconductor layer 66e and the upper conductive layer 17e at the step shown in FIG. 8(l).

Figure 6:
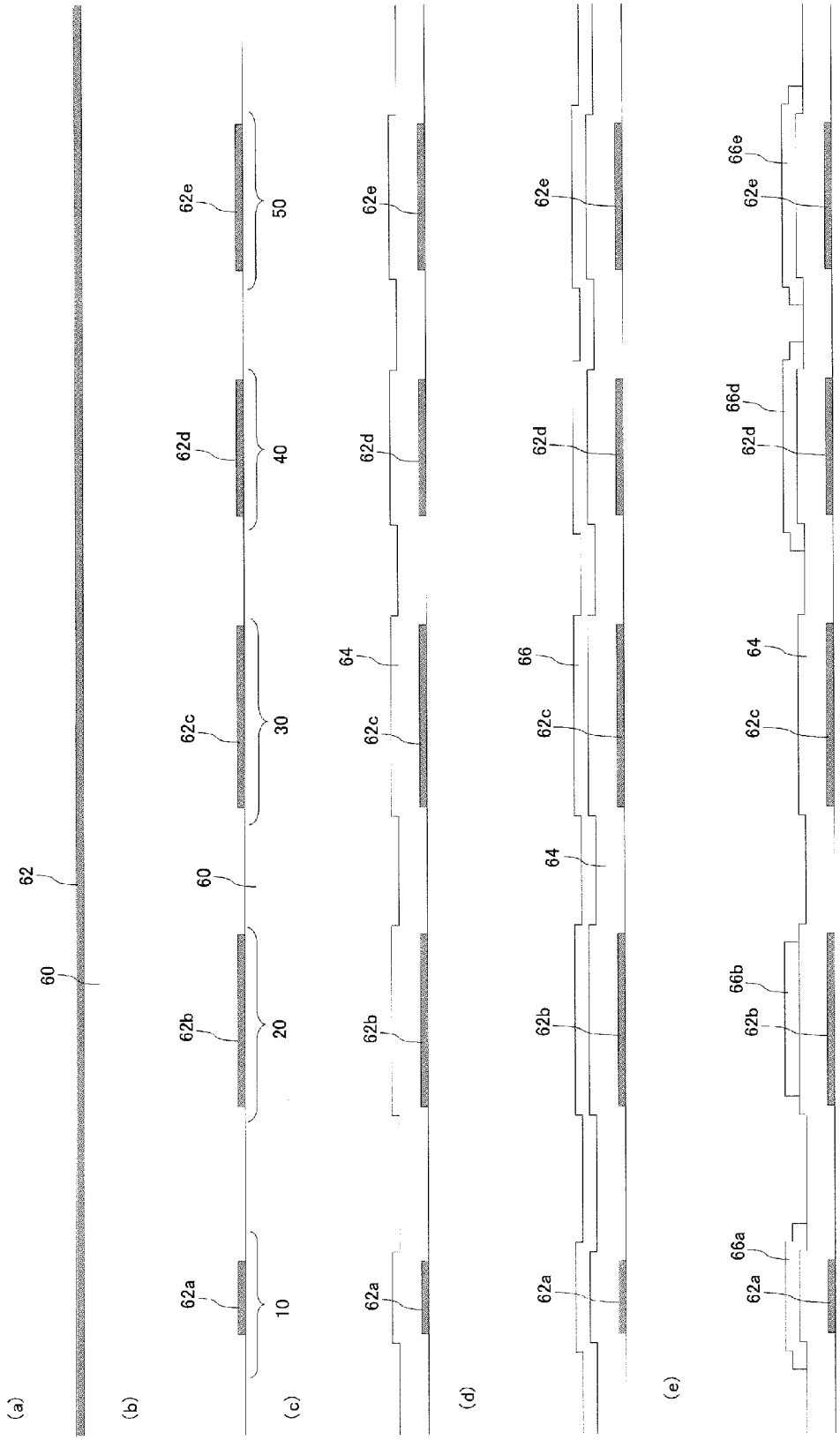
FIG. 6 (a) to (e) are cross-sectional views showing part of the production steps for the semiconductor device 100.
Figure 7:
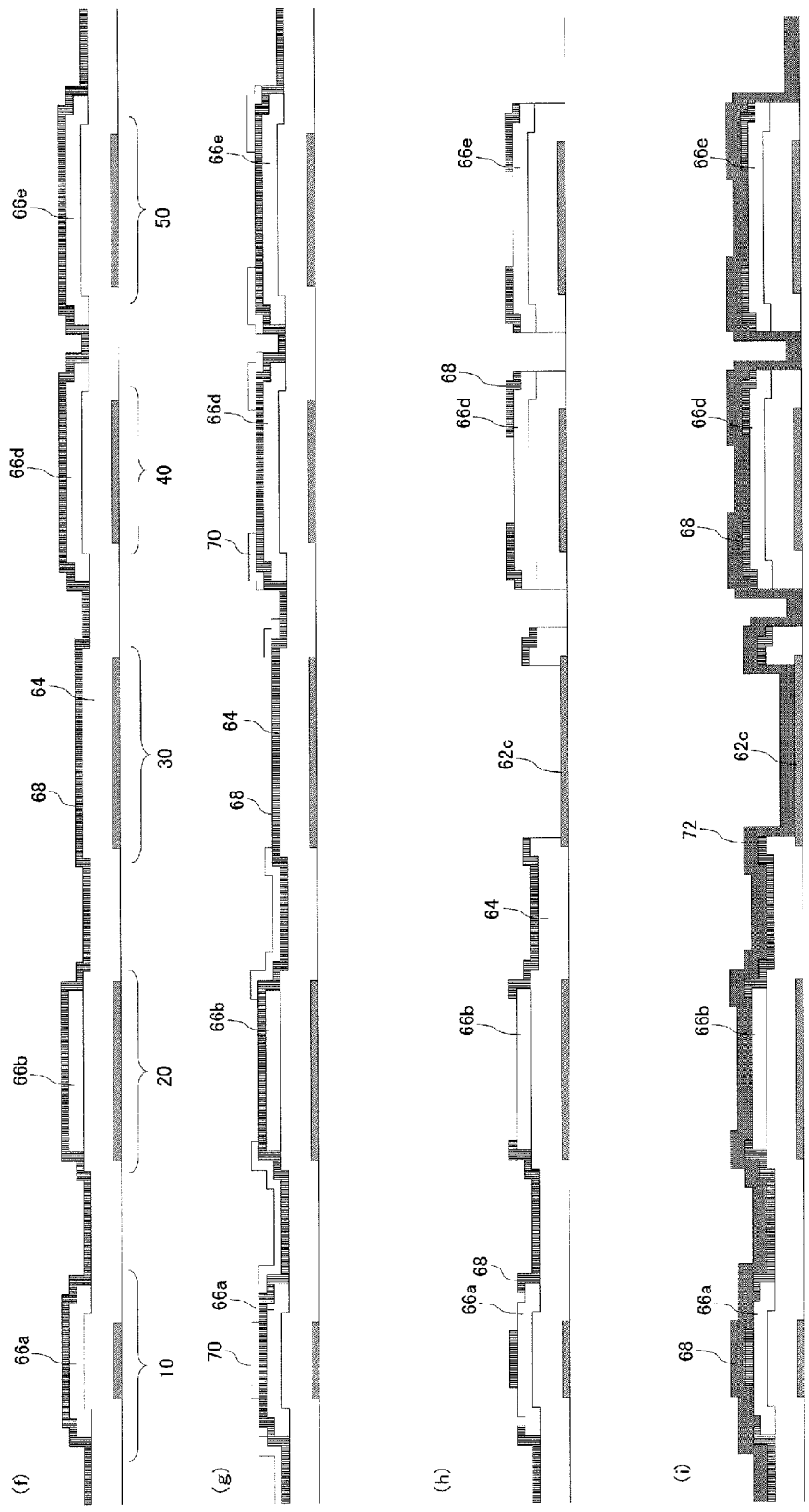
FIG. 7 (f) to (i) are cross-sectional views showing part of the production steps for the semiconductor device 100.
Figure 8:
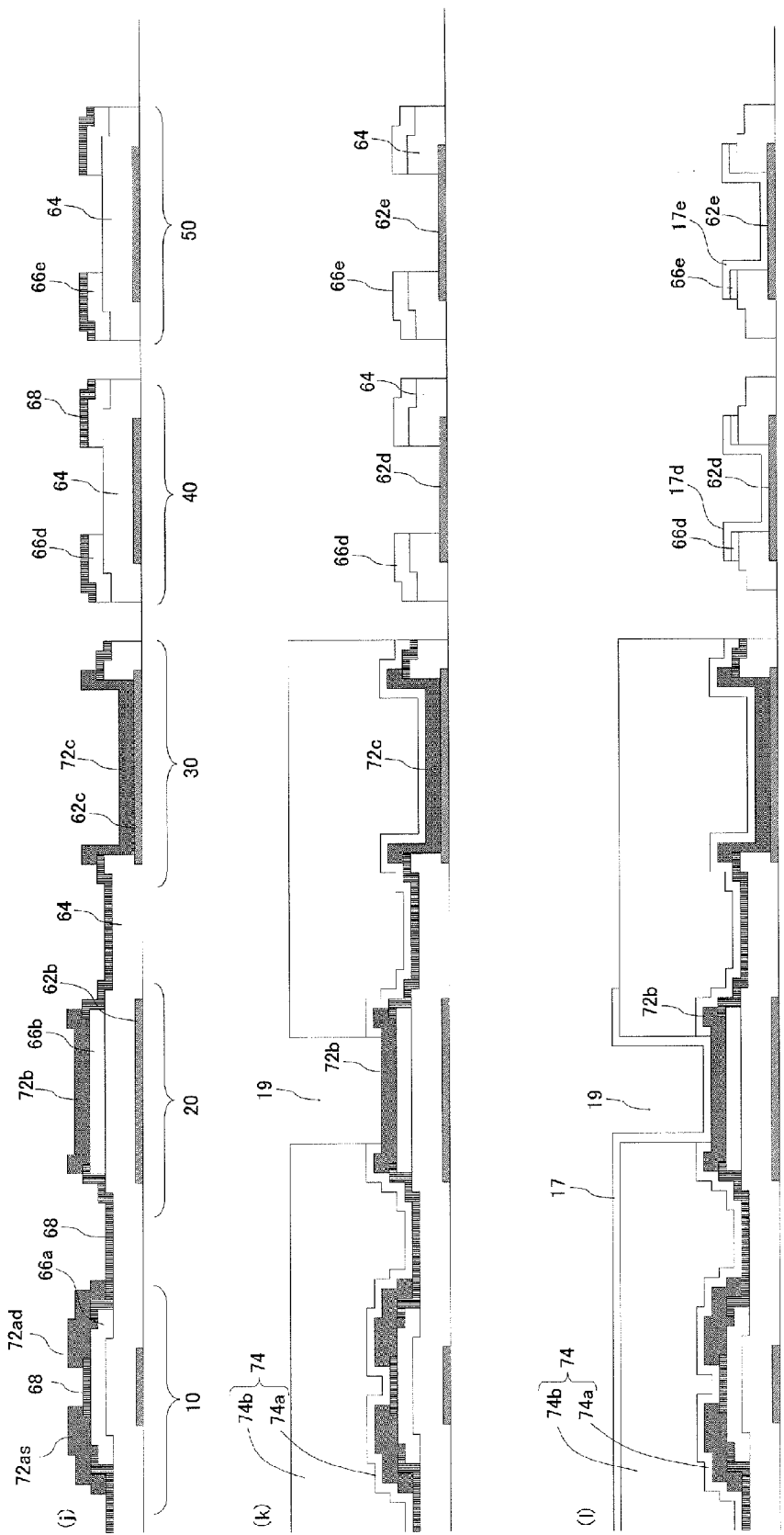
FIG. 8 (j) to (l) are cross-sectional views showing part of the production steps for the semiconductor device 100.

Note that the production method for the terminal portion 50 of the above-described structure is not limited to the method illustrated in FIG. 6 to FIG. 8. For example, although FIG. 6 to FIG. 8 illustrate that the terminal portion 50 is produced on the substrate 60 together with the TFT 10 and the capacitor portion, etc., the structure and process for the TFT 10 and the capacitor portion may be different from those in the example shown in FIG. 6 to FIG. 8. Moreover, the terminal portion 50 may be fabricated alone on the substrate 60, or fabricated on the substrate 60 together with any semiconductor devices other than TFTs.

Hereinafter, a method for efficiently producing the terminal portion 50 will be described. In the following description, the steps shown in FIG. 6 to FIG. 8 may be revisited as an example, for ease of understanding.

First, a lower metal layer 62e is formed on a substrate 60. Next, a first insulating layer 64 is formed so as to cover a lower metal layer 62e. Thereafter, a semiconductor layer 66e is formed on the first insulating layer 64 (see FIG. 6(e)).

Next, a protection layer (insulating layer) 68 is formed so as to cover portions of the semiconductor layer 66e. The protection layer 68 is disposed so as to overlap portions of the lower metal layer 62e via the first insulating layer 64 and the semiconductor layer 66e, when viewed from the normal direction of the substrate 60 (see, for example, FIG. 7(h)).

Then, the semiconductor layer 66e is partially removed, with the protection layer 68 being an etching mask (see, for example, FIG. 8(j)). Note that this step may be performed concurrently with the source-drain isolation step of the TFT 10. As a result of this, in a step of patterning the metal layer to become source/drain electrodes, the protection layer 68 functions as a barrier layer, thus making it possible to leave the semiconductor layer 66e in the regions forming the terminal portions, while reducing damage to the semiconductor layer 66e.

Next, the protection layer 68 on the semiconductor layer 66e is removed, and the portions of the first insulating layer 64 that are not covered by the semiconductor layer 66e are removed, thereby creating openings (see FIG. 8(k)). In other words, the semiconductor layer 66e functions as an etching stopper during the etching of the protection layer 68, and yet functions as an etching mask during the etching of the first insulating layer 64. Thus, the ability to utilize as an etching mask the semiconductor layer 66e, which in itself was kept intact by the protection layer 68, is advantageous because it eliminates the need to form a separate mask for creating the openings. Through this step, a portion of the lower metal layer 62e becomes exposed. Moreover, the end of the semiconductor layer 66e becomes aligned with the side wall of the opening of the first insulating layer 64.

Thereafter, an upper conductive layer 17e is formed within the opening and on the semiconductor layer 66e (see FIG. 8(l)). Note that, when a plurality of terminal portions are to be formed on the substrate 60, electrical conduction between the terminal portions 50 may occur if the semiconductor layers 66e of adjacent terminal portions 50 are connected. Therefore, it is preferable that the semiconductor layers 66e of the terminal portions 50 have respectively separate patterns. For example, during the patterning of the upper conductive layer 17d, the semiconductor layer 66e may also be allowed to be patterned at the same time. In that case, as viewed from the normal direction of the substrate 60, the end of the upper conductive layer 17e and the end of the semiconductor layer 66d will be aligned. However, in the case where wet etching is used for the patterning, the side wall of the semiconductor layer 66d may have a reverse tapered shape in a cross section perpendicular to the substrate 60, such that it is slanted from the end of the upper conductive layer 17e toward the opening. Thus, by simultaneously patterning the upper conductive layer 17d and the semiconductor layer 66e, it becomes possible to leave the semiconductor layer 66e between the upper conductive layer 17e and the first insulating layer 64 only around the opening perimeter, without increasing the number of production steps. Therefore, electrical conduction between terminal portions 50 can be suppressed while ensuring reliability of the terminal portions 50.

Thus, a production method for the TFT substrate 100 has been described. Now, the liquid crystal display device 1000 can be obtained by adding, through known production methods, other members to the TFT substrate which has been fabricated by the above-described production method of the TFT 100.

Figure 9:
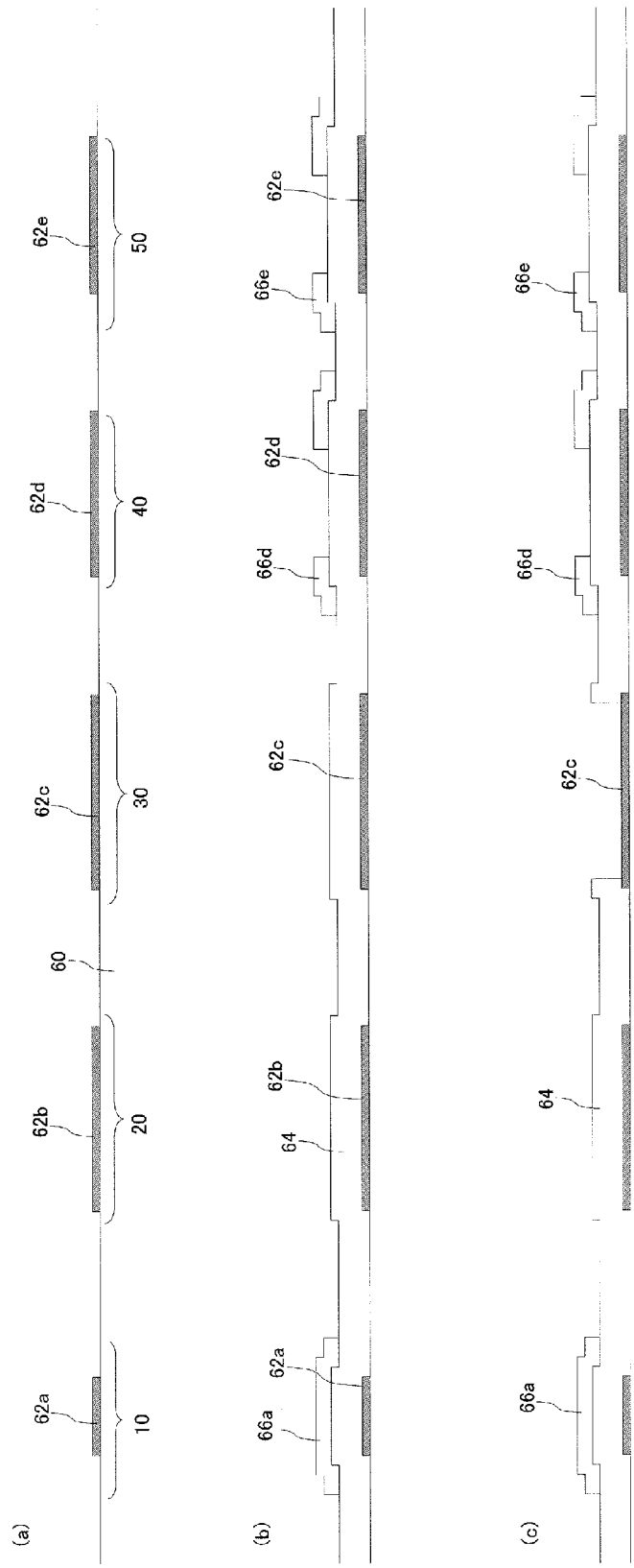
FIG. 9 (a) to (c) are cross-sectional views showing part of the production steps for a semiconductor device according to a first reference example.
Figure 10:
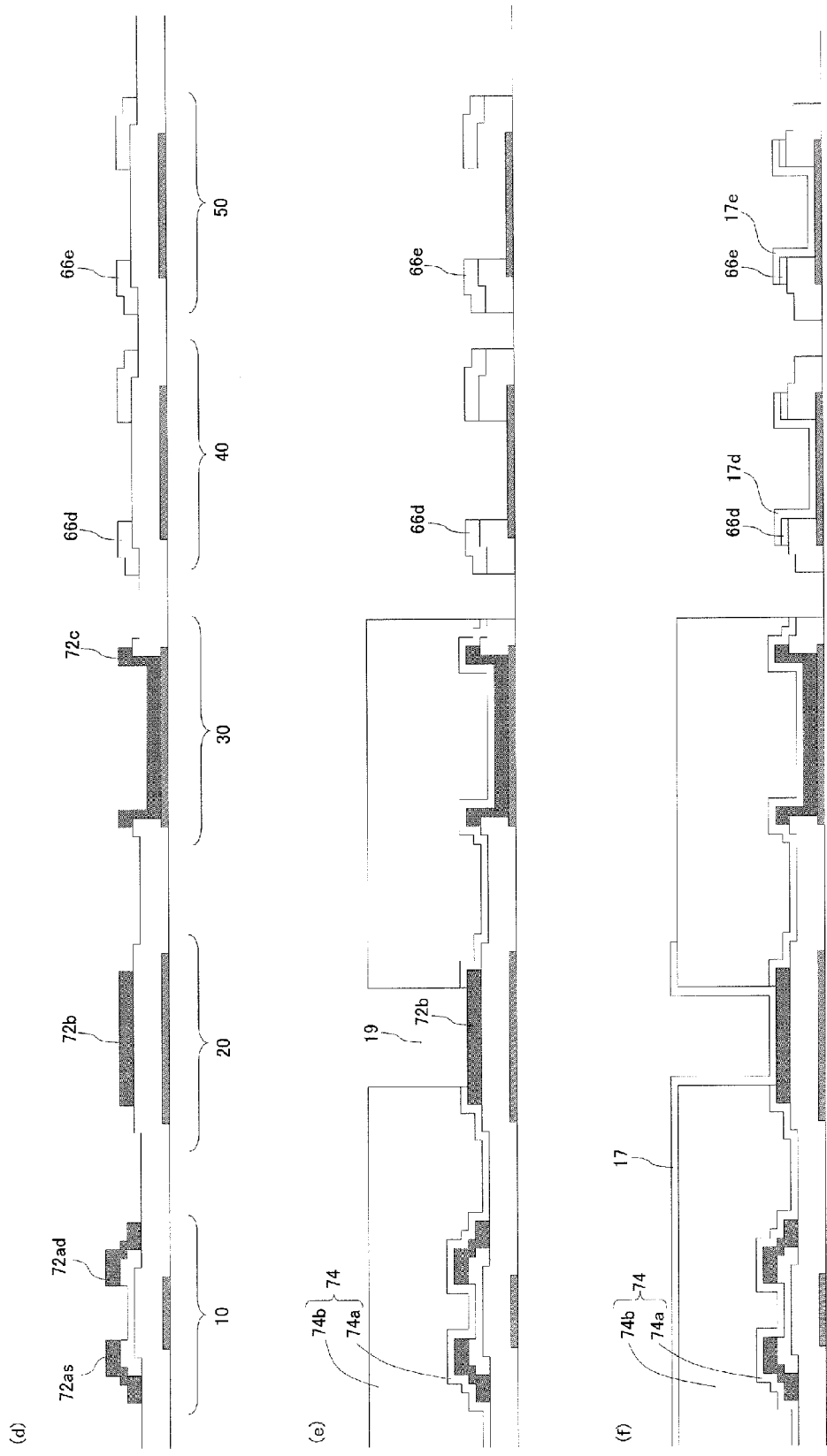
FIG. 10 (d) to (f) are cross-sectional views showing part of the production steps for the semiconductor device according to the first reference example.

Next, a production method for a semiconductor device according to a first reference example will be described with reference to FIGS. 9 and 10.

FIGS. 9(a) to (c) and FIGS. 10(d) to (f) are cross-sectional views schematically showing production steps (A1-F1) for a semiconductor device according to a first reference example. The semiconductor device of the first reference example is a semiconductor device lacking the protection layer 68, which was included in the aforementioned semiconductor device 100; the following steps will illustrate a typical example which is likely an efficient production method for such a semiconductor device. Members and portions corresponding to the semiconductor device 100 will be denoted by like reference numerals, their detailed descriptions omitted.

Step (A1):

First, through steps similar to FIGS. 6(a) and (b), as shown in FIG. 9(a), the gate electrode 62a of the TFT 10, the first capacitor electrode 62b of the storage capacitor 20, the lower metal layer 62c of the first connecting portion 30, the lower metal layer 62d of the second connecting portion 40, and the lower metal layer 62e of the terminal portion 50 of the semiconductor device of the first reference example are formed. A first mask is used here.

Step (B1):

In a step corresponding to FIGS. 6(c) to (e), as shown in FIG. 9(b), the oxide semiconductor layer 66a of the TFT 10, the semiconductor layer 66d of the second connecting portion 40, and the semiconductor layer 66e of the terminal portion 50 are formed on the first insulating layer 64. A second mask is used here.

Step (C1):

In a step corresponding to FIGS. 7(f) to (h), as shown in FIG. 9(c), the first insulating layer 64 of the first connecting portion 30 is removed, thereby exposing the lower metal layer 62c. A third mask is used here.

Step (D1):

In a step corresponding to FIG. 7(i) to FIG. 8(j), as shown in FIG. 10(d), the source electrode 72as and the drain electrode 72ad of the TFT 10, the second capacitor electrode 72b of the storage capacitor 20, and the upper metal layer 72c of the first connecting portion 30 are formed. A fourth mask is used here.

Step (E1):

In a step corresponding to FIG. 8(k), as shown in FIG. 10(e), the second insulating layer 74 is formed on the TFT 10, the storage capacitor 20, and the first connecting portion 30. The contact hole 19 is formed in the second insulating layer 74 on the storage capacitor 20, thereby exposing the second capacitor electrode 72b. A fifth mask is used here.

Step (F1):

In a step corresponding to FIG. 8(l), as shown in FIG. 10(f), the pixel electrode 17 is formed over the TFT 10 and the storage capacitor 20, and the upper conductive layers 17d and 17e of the second connecting portion 40 and the terminal portion 50 are formed. The pixel electrode 17 over the storage capacitor 20 is connected to the second capacitor electrode 72b within the contact hole 19. A sixth mask is used here.

Thus, the production method for the semiconductor device of the first reference example employs six masks. However, since this semiconductor device does not have the protection layer 68, the oxide semiconductor layer of the TFT 10 may be damaged through sputtering and the like, so that the TFT 10 may not adequately function as an oxide semiconductor TFT. If a step of forming the protection layer 68 is straightforwardly added to the production method of the first reference example in order to solve this problem, a photolithography step (seventh mask step) will be entailed for that purpose, thus increasing the production time and cost.

With the production method of the semiconductor device 100 according to the present invention, it is possible to produce a TFT substrate of a high-performance semiconductor device and display device having a protection layer by using six masks, thus reducing the production time and cost.

Figure 11:
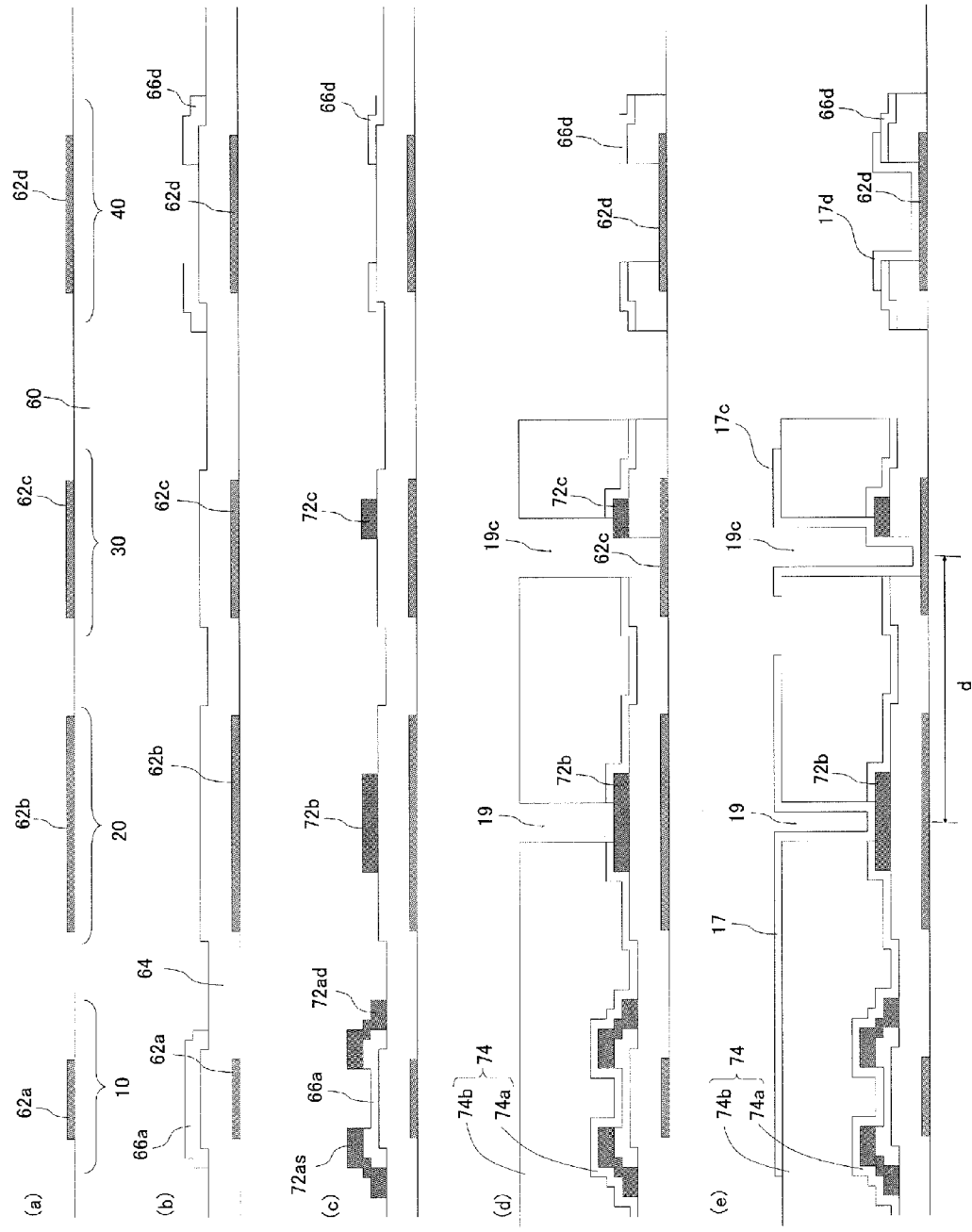
FIG. 11 (a) to (e) are cross-sectional views showing the production steps for a semiconductor device according to a second reference example.
Figure 12:
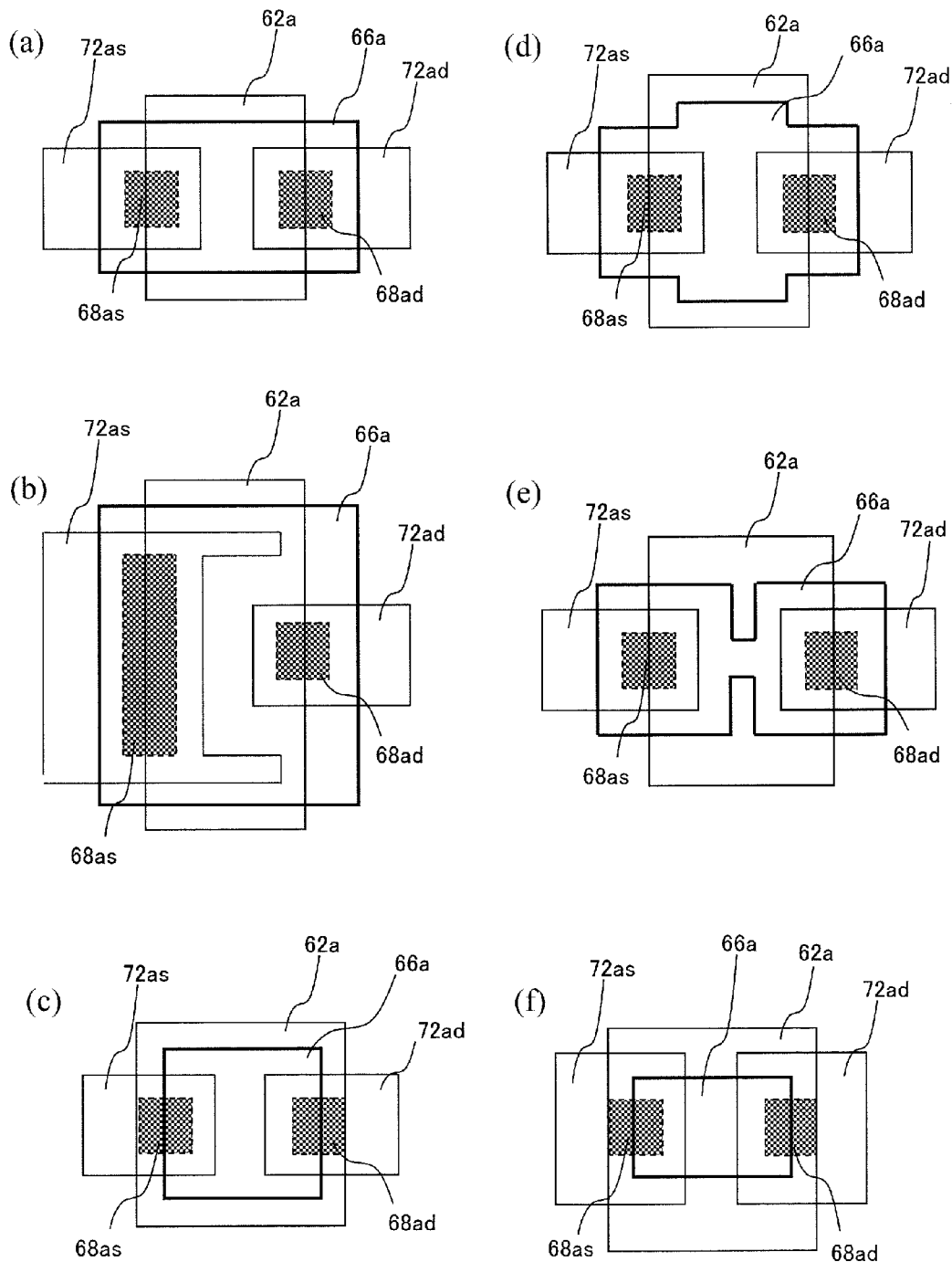
FIG. 12 (a) to (f) are plan views showing construction examples for the TFT of the semiconductor device 100.

Next, with reference to FIG. 11, a production method for a semiconductor device according to a second reference example will be described.

FIGS. 11(a) to (e) are cross-sectional views schematically showing production steps (A2-E2) for the semiconductor device of the second reference example. The semiconductor device of the second reference example is directed to a production method which forms the semiconductor device through only five masks in order to improve the production efficiency. Members and portions corresponding to the semiconductor device 100 will be denoted by like reference numerals, their detailed descriptions omitted. Since the production method for the terminal portion 50 is the same as the production method for the second connecting portion, it is omitted from illustration in the figures.

Step (A2):

First, through steps similar to FIGS. 6(a) and (b), as shown in FIG. 10(a), the gate electrode 62a of the TFT 10, the first capacitor electrode 62b of the storage capacitor 20, the lower metal layer 62c of the first connecting portion 30, the lower metal layer 62d of the second connecting portion 40, and the lower metal layer 62e of the terminal portion 50 of the semiconductor device of the second reference example are formed. A first mask is used here.

Step (B2):

In a step corresponding to FIGS. 6(c) to (e), as shown in FIG. 10(b), the oxide semiconductor layer 66a of the TFT 10, the semiconductor layer 66d of the second connecting portion 40, and the semiconductor layer 66e of the terminal portion 50 are formed on the first insulating layer 64. A second mask is used here.

Step (C2):

In a step corresponding to FIG. 7(i) and FIG. 8(j), as shown in FIG. 10(c), without forming the protection layer 68, and without removing the first insulating layer 64 of the first connecting portion, the source electrode 72as and the drain electrode 72ad of the TFT 10, the second capacitor electrode 72b of the storage capacitor 20, and the upper metal layer 72c of the first connecting portion 30 are formed. A third mask is used here.

Step (D2):

In a step corresponding to FIG. 8(k), as shown in FIG. 11(d), the second insulating layer 74 is formed on the TFT 10, the storage capacitor 20, and the first connecting portion 30. The contact hole 19 is formed in the second insulating layer 74 on the storage capacitor 20, thereby exposing the second capacitor electrode 72b. Moreover, a contact hole 19c is also formed in the second insulating layer 74 over the second connecting portion 30, thereby exposing the lower metal layer 62c and the upper metal layer 72c. A fourth mask is used here.

Step (E2):

In a step corresponding to FIG. 8(l), as shown in FIG. 11(e), the pixel electrode 17 is formed over the TFT 10 and the storage capacitor 20, and the upper conductive layers 17d and 17e of the second connecting portion 40 and the terminal portion 50 are formed. The pixel electrode 17 over the storage capacitor 20 is connected to the second capacitor electrode 72b within the contact hole 19. Moreover, a metal layer 17c which is made of the same material as the pixel electrode is also formed on the second connecting portion 30, such that the lower metal layer 62c and the upper metal layer 72c are electrically connected via the metal layer 17c within the contact hole 19c. A fifth mask is used here.

Thus, the production method for the semiconductor device of the second reference example employs five masks. However, with this production method, there are production difficulties in designing the width (d1 in FIG. 3) of the surrounding region FA, called the frame, to be small (e.g., d1 being 1 mm or less), or forming the interval between the terminal portions 50 (d2 in FIG. 5) to be very short (e.g., d2 being 50 μm or less). Therefore, it may not be possible to adopt the production method of the second reference example.

Moreover, similarly to the production method of the first reference example, the production method of the second reference example is also a production method for a semiconductor device in which the protection layer 68 is not adopted. Therefore, when the protection layer 68 is to be introduced for enhanced performance of the device, there will be a problem of an increased number of steps.

With the production method of the semiconductor device 100 according to the present invention, a semiconductor device having a protection layer can be produced without forming a contact hole 19c in the second insulating layer 74 at the first connecting portion 30. Therefore, it is possible to produce a small-sized and high-performance semiconductor device and display device with a good production efficiency.

In the present embodiment, it is preferable that the protection layer 68 contains $SiO_2$. This will allow oxygen to be supplied from the protection layer 68 to the oxide semiconductor layer 66a, which becomes an active layer of the TFT, thereby further reducing the oxygen defects occurring in the oxide semiconductor layer 66a. Since this will restrain a shift in the oxide semiconductor layer 66a toward lower resistance caused by the oxygen defects, leak currents and hysteresis can be alleviated. For similar reasons, it is also preferable that the first insulating layer 64 in contact with the oxide semiconductor layer 66a is made of $SiO_2$.

Moreover, it is preferable that the protection layer 68 covers the entire upper face (except for the source/drain regions) of the island-shaped oxide semiconductor layer 66a and the entire side wall thereof. With such a construction, in the patterning step for forming the source/drain electrodes, oxygen defects are restrained from occurring through an oxidation-reduction reaction in the channel region of the oxide semiconductor layer 66a and in its neighborhood. Since this will restrain a shift in the oxide semiconductor layer 66a toward lower resistance caused by the oxygen defects, leak currents and hysteresis can be alleviated. Moreover, it is preferable that the protection layer 68 is longer than the oxide semiconductor 66a along the channel width direction, and is also in contact with the upper face of the first insulating layer 64 located in the neighborhood of the side wall of the oxide semiconductor layer 66a. As a result, not only the upper face but also the side wall of the oxide semiconductor layer 66a can be protected by the protection layer 68 with greater certainty.

It is preferable that the oxide semiconductor layer 66a of the present embodiment is a layer made of a Zn—O type semiconductor (ZnO), an In—Ga—Zn—O type semiconductor (IGZO), an In—Zn—O type semiconductor (IZO), or a Zn—Ti—O type semiconductor (ZTO), for example.

Next, implementations of the TFT 10 of the semiconductor device 100 will be described.

FIGS. 12(a) to (f) are plan views schematically showing first to sixth construction examples of the TFT 10. FIGS. 12(a) to (f) show shapes, according to the first to sixth construction examples, of the gate electrode 62a, the oxide semiconductor layer 66a, the source electrode 72as, and the drain electrode 72ad of the TFT 10, and the gaps 68as and 68ad in the protection layer 68 for allowing the oxide semiconductor layer 66a to be connected to each of the source electrode 72as and the drain electrode 72ad. Each of the TFTs according to the implementations shown in FIGS. 12(a) to (f) can be used as the TFT 10 of the semiconductor device 100.

(Embodiment 3)

Next, a semiconductor device 101 of a liquid crystal display device 1001 according to Embodiment 3 of the present invention will be described.

Figure 13:
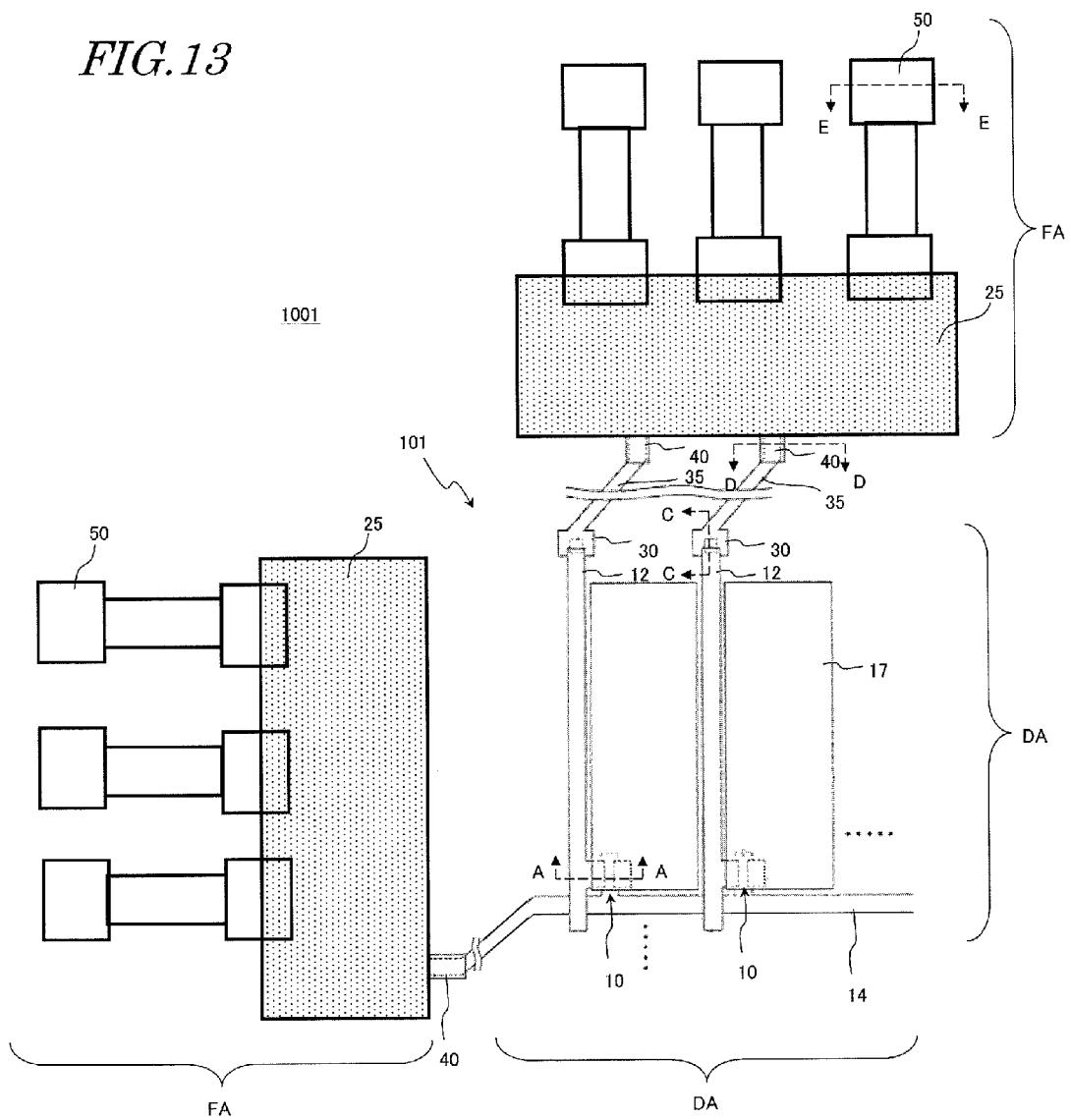
FIG. 13 A plan view schematically showing the construction of a TFT substrate (semiconductor device 101) of a liquid crystal display device 1001 according to Embodiment 3 of the present invention.

FIG. 13 is a plan view schematically showing the construction of the semiconductor device 101, corresponding to the plan view of the semiconductor device 100 shown in FIG. 5. Any constituent elements of the semiconductor device 101 other than those described above are basically identical to those of the semiconductor device 100. Constituent elements with like functions are denoted by like reference numerals, with their descriptions omitted.

The semiconductor device 101 has a construction which is obtained by removing from the semiconductor device 100 of FIG. 5 the following: the storage capacitors 20, the storage capacitor line 15, the storage capacitor connection line 16, and the connecting portion 30, connection line 35, and connecting portion 40 which correspond to the storage capacitor connection line 16. In this case, the drain electrode 72ad of the TFT 10 is connected to the pixel electrode 17 via a contact hole which is formed in the overlying second insulating layer 74. For example, a display device which performs rapid display driving may not require any storage capacitors, and the semiconductor device 101 is suitably used as a TFT substrate of such a display device.

The TFT 10, the connecting portions 30, the connecting portions 40, and the terminal portions 50 of the semiconductor device 101 are identical in construction and production method to those of the semiconductor devices 100 of Embodiments 1 and 2. Thus, in accordance with the semiconductor device 101, too, it is possible to produce a semiconductor device and display device having high-performance TFTs with a good production efficiency.

(Embodiment 4)

Next, an organic EL display device 1002 according to Embodiment 4 of the present invention will be described.

Figure 14:
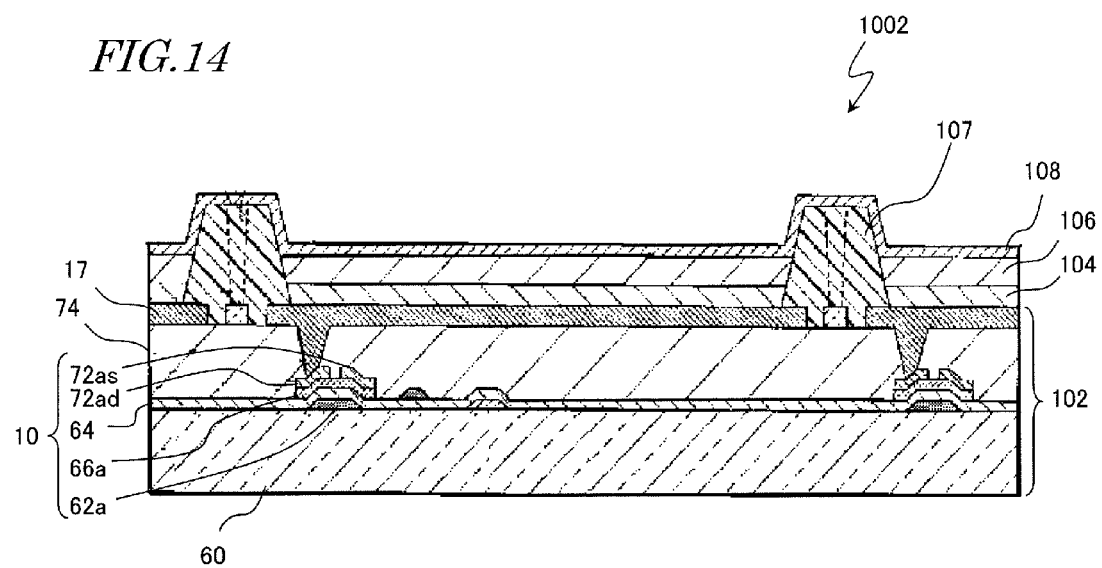
FIG. 14 A plan view schematically showing the construction of an organic EL display device 1002 according to Embodiment 4 of the present invention.
Figure 16:
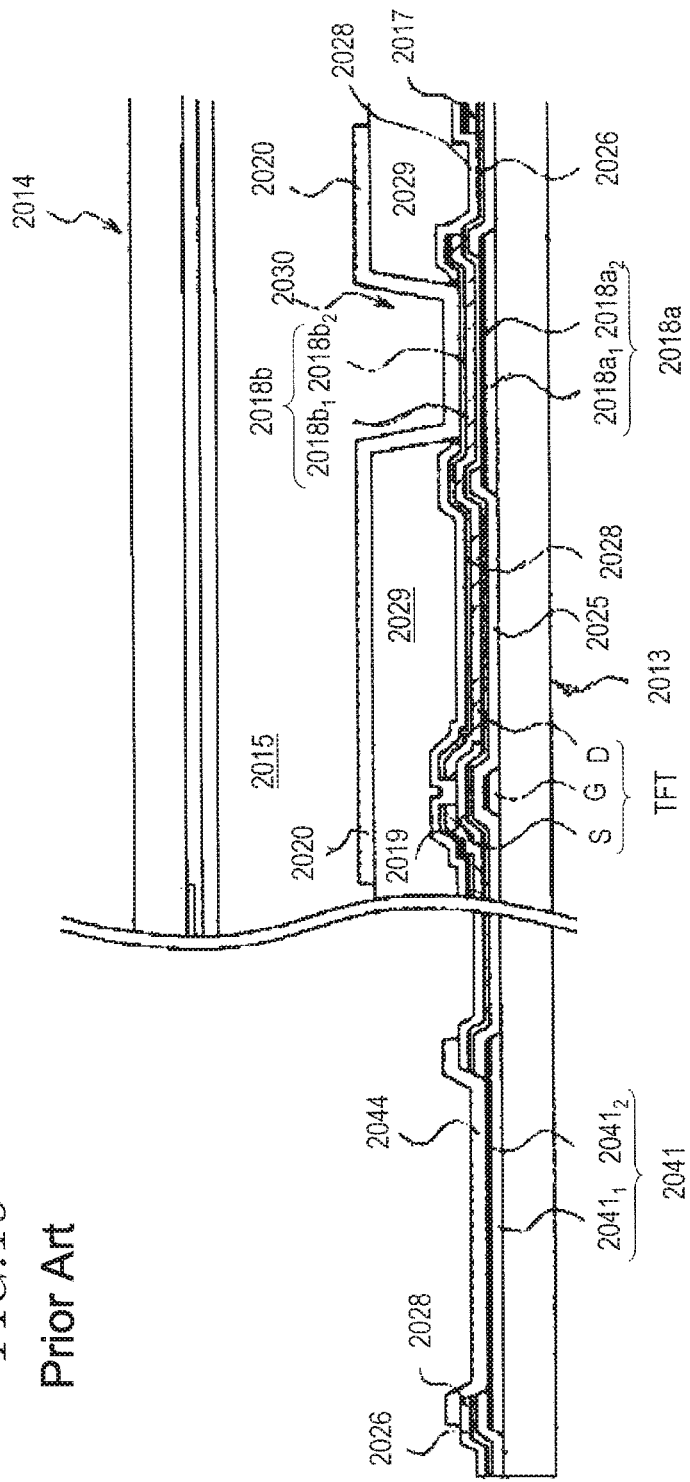
FIG. 16 A cross-sectional view of a TFT and a terminal portion of the conventional TFT substrate shown in FIG. 15.
Figure 17:
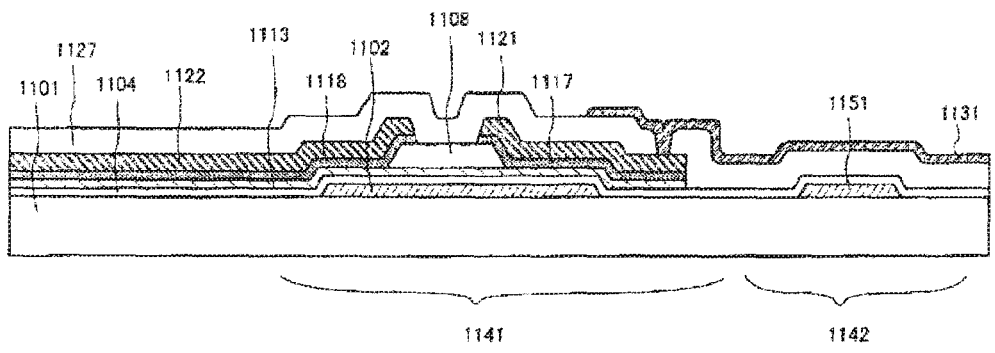
FIG. 17 A cross-sectional view showing a portion of a conventional TFT substrate.

FIG. 14 is a cross-sectional view schematically showing the construction of an organic EL display device 1002 (which may be simply referred to as "display device 1002"). As shown in the figure, the display device 1002 includes a TFT substrate 102, a hole transport layer 104 provided on the TFT substrate 102, a light emission layer 106 provided on the hole transport layer 104, and a counter electrode 108 provided on the light emission layer 106. The hole transport layer 104 and the light emission layer 106 constitute an organic EL layer. The organic EL layer is partitioned by insulative protrusions 107, such that each partitioned organic EL layer defines the organic EL layer of one pixel.

The TFT substrate 102 basically has the same construction as the TFT substrate 100 in the semiconductor device 100 of Embodiment 1 and the liquid crystal display device 1000 of Embodiment 2. In other words, the TFT substrate 102 includes: TFTs 10 formed on a substrate 60; and storage capacitor electrodes 20, connecting portions 30, connecting portions 40, and terminal portions 50, which are omitted from illustration here. Each TFT 10 includes a gate electrode 62a, a first insulating layer 64, an oxide semiconductor layer 66a, a protection layer 68 (which is omitted from illustration here), a source electrode 72as, and a drain electrode 72ad, which are formed on the substrate 60.

Furthermore, the TFT substrate 102 includes a second insulating layer 74 stacked so as to cover the TFTs 10 and pixel electrodes 17 which are formed on the second insulating layer 74. Each pixel electrode 17 is connected to the drain electrode 72ad within a contact hole which is formed in the second insulating layer 74.

The planar construction of the TFT substrate 102 is basically the same as that shown in FIGS. 3 to 5, and like constituent elements will be denoted by reference numerals, their descriptions omitted. Note that the semiconductor device 101 of Embodiment 3, which lacks storage capacitors 20, may be used as the TFT substrate 102.

When a voltage is applied across the organic EL layer by a pixel electrode 17 and the counter electrode 108, holes occurring at the pixel electrode 17 are sent via the hole transport layer 104 to the light emission layer 106. At the same time, electrons occurring at the counter electrode 108 move to the light emission layer 106, and light emission occurs in the light emission layer 106 through recombination of such holes and electrons. Desired displaying is achieved by controlling light emission in the light emission layer 106 for each pixel by using the TFT substrate 102, which is an active matrix substrate.

Known materials and structures may be employed for the materials of the hole transport layer 104, the light emission layer 106, and the counter electrode 108, and their layer structures. It is possible to provide a hole injection layer between the hole transport layer 104 and the light emission layer 106 for an improved hole injection efficiency. In order to enhance the efficiency of light emission and achieve a high electron injection efficiency into the organic EL layer, it is preferable to use a material with a high transmittance and a small work function for the counter electrode 108.

Since a semiconductor device as described in Embodiments 1 to 3 is used as a TFT substrate in the organic EL display device 1002 of the present embodiment, effects similar to those described in Embodiments 1 to 3 are obtained. According to the present embodiment, an organic EL display device 1002 capable of high-performance displaying can be provided with a good production efficiency.

INDUSTRIAL APPLICABILITY

The present invention is suitably used for a semiconductor device having thin film transistors, a liquid crystal display device having thin film transistors on a TFT substrate, and a display device such as an organic EL display device.

REFERENCE SIGNS LIST 5 pixel
10 thin film transistor (TFT)
12 signal line
14 scanning line
15 storage capacitor line
16 storage capacitor connection line
17 pixel electrode
17d, 17e upper conductive layer
19 contact hole
20 storage capacitor
25 electrical element
30 connecting portion (first connecting portion)
35 connection line
40 connecting portion (second connecting portion)
50 terminal portion
60 substrate
62 first metal layer
62a gate electrode
62b first capacitor electrode
62c, 62d, 62e lower metal layer
64 first insulating layer (gate insulating layer, insulating layer)
66 oxide semiconductor
66a oxide semiconductor layer
66b, 66d, 66e semiconductor layer (third, first, second semiconductor layers)
68 protection layer
70 mask pattern
72 second metal layer
72as source electrode
72ad drain electrode
72b second capacitor electrode
72c upper metal layer
74 second insulating layer
74a protection film
74b interlayer insulating layer
100, 101, 102 semiconductor device (TFT substrate)
110 scanning line driving circuit
120 signal line driving circuit
130 control circuit
200 counter substrate
210, 220 polarizer
230 backlight unit
1000, 1001 liquid crystal display device
1002 organic EL display device

The invention claimed is:
1. A semiconductor device comprising a thin film transistor, a first connecting portion for electrically connecting the thin film transistor to external wiring, and a second connecting portion electrically connected to the first connecting portion via a connection line,
   the thin film transistor including:
      a gate electrode;
      a first insulating layer formed on the gate electrode;
      an oxide semiconductor layer formed on the first insulating layer;
      a protection layer disposed in contact with the oxide semiconductor layer;
      a source electrode and a drain electrode formed on the protection layer so that a portion of each is in contact with the oxide semiconductor layer; and
      a second insulating layer formed on the source electrode and the drain electrode,
   the first connecting portion including:
      a lower metal layer made of a same material as the gate electrode;
      an upper metal layer formed so as to be in contact with the lower metal layer, the upper metal layer formed being made of a same material as the source electrode and the drain electrode; and
      an insulating layer formed on the upper metal layer, the insulating layer being made of a same material as the second insulating layer;
   the second connecting portion including:
      a lower metal layer made of a same material as the gate electrode; and
      an upper conductive layer formed on the lower metal layer of the second connecting portion; wherein
   a region in which the upper metal layer, a layer made of a same member as the protection layer of the thin film transistor, and the upper metal layer are stacked is formed in the first connecting portion; and a region in which the lower metal layer and the upper conductive layer of the second connecting portion are in contact, and a region in which an insulating layer made of a same material as the first insulating layer and a semiconductor layer made of a same material as the oxide semiconductor layer are stacked in between the lower metal layer and the upper conductive layer of the second connecting portion, are formed in the second connecting portion.

2. The semiconductor device of claim 1, comprising a terminal portion for electrically connecting the thin film transistor to external wiring via the first connecting portion and the second connecting portion, the terminal portion including a lower metal layer made of a same material as the gate electrode and an upper conductive layer formed on the lower metal layer of the terminal portion, wherein a region in which the lower metal layer and the upper conductive layer of the terminal portion are in contact, and a region in which an insulating layer made of a same material as the first insulating layer and a semiconductor layer made of a same material as the oxide semiconductor layer are stacked in between the lower metal layer and the upper conductive layer of the terminal portion, are formed in the terminal portion.

3. The semiconductor device of claim 2, wherein a surface of each of the oxide semiconductor layer of the thin film transistor, the semiconductor layer of the second connecting portion, and the semiconductor layer of the terminal portion is made conductive through a plasma etching treatment.

4. A display device comprising the semiconductor device of claim 1, the display device including:

a plurality of pixels arranged in a matrix array; and a pixel electrode formed on the second insulating layer within a pixel, wherein the pixel electrode is electrically connected to the drain electrode of the thin film transistor; and the upper conductive layer of the second connecting portion is made of a same material as the pixel electrode.

5. The display device of claim 4, comprising a storage capacitor disposed within a pixel, the storage capacitor including:

a first capacitor electrode made of a same material as the gate electrode;

an insulating layer formed on the first capacitor electrode, the insulating layer being made of a same material as the first insulating layer;

a semiconductor layer formed on the insulating layer of the storage capacitor, the semiconductor layer being made of a same material as the oxide semiconductor layer; and a second capacitor electrode formed on the semiconductor layer of the storage capacitor, the second capacitor electrode being made of a same material as the drain electrode.

6. The display device of claim 5, wherein the second capacitor electrode of the storage capacitor is in electrical contact with the pixel electrode within an opening formed in the second insulating layer.

7. The display device of claim 4, wherein, the display device includes a display section containing a plurality of pixels arranged in a matrix array and a peripheral portion disposed outside the display section;

an electrical element for controlling displaying by the display section is disposed in the peripheral portion; and the thin film transistor and the electrical element in the peripheral portion are electrically connected via the first connecting portion and the second connecting portion.

8. The display device of claim 7, wherein the terminal portion is a terminal disposed in the peripheral portion for attaching a flexible printed wiring board.

9. The semiconductor device of claim 1, wherein the oxide semiconductor layer includes an In—Ga—Zn— semiconductor.

10. The display device of claim 4, wherein the oxide semiconductor layer includes an In—Ga—Zn— semiconductor.

* * * * *